(12) United States Patent
Colombo et al.

(10) Patent No.: US 10,072,355 B2
(45) Date of Patent: Sep. 11, 2018

(54) METHODS OF FORMING GRAPHENE SINGLE CRYSTAL DOMAINS ON A LOW NUCLEATION SITE DENSITY SUBSTRATE

(71) Applicant: Board of Regents, The University of Texas System, Austin, TX (US)

(72) Inventors: Luigi Colombo, Dallas, TX (US); Rodney S. Ruoff, Austin, TX (US); Yufeng Hao, New York, NY (US)

(73) Assignee: Board of Regents, The University of Texas System, Austin, TX (US)

( * ) Notice: Subject to any disclaimer, the term of this patent is extended or adjusted under 35 U.S.C. 154(b) by 565 days.

(21) Appl. No.: 14/252,953

(22) Filed: Apr. 15, 2014

(65) Prior Publication Data
US 2015/0292112 A1 Oct. 15, 2015

(51) Int. Cl.
| C30B 25/18 | (2006.01) |
| C30B 29/02 | (2006.01) |
| C30B 33/02 | (2006.01) |
| C01B 32/186 | (2017.01) |

(52) U.S. Cl.
CPC .......... C30B 25/186 (2013.01); C01B 32/186 (2017.08); C30B 29/02 (2013.01); C30B 33/02 (2013.01); *C01B 2204/02* (2013.01)

(58) Field of Classification Search
CPC ......... C30B 25/00; C30B 25/02; C30B 25/16; C30B 25/18; C30B 25/183; C30B 25/186; C30B 29/00; C30B 29/02; C30B 29/04; C30B 33/00; C30B 33/02; C01B 31/0438; C01B 31/0446; C01B 31/0453; C01B 31/0461; C01B 2204/00; C01B 2204/02; C23C 16/00; C23C 16/02; C23C 16/0209; C23C 16/0218; C23C 16/22; C23C 16/26
USPC .......... 117/84–86, 88, 94–95, 101–102, 104, 117/106, 928–929
See application file for complete search history.

(56) References Cited

U.S. PATENT DOCUMENTS

| 6,926,920 | B2 | 8/2005 | Jang et al. | |
| 8,470,400 | B2 | 6/2013 | Colombo et al. | |
| 2002/0160112 | A1 | 10/2002 | Sakai et al. | |
| 2012/0269717 | A1* | 10/2012 | Radhakrishnan | B82Y 40/00 423/448 |
| 2012/0288433 | A1* | 11/2012 | Sutter | B82Y 30/00 423/445 B |
| 2013/0316167 | A1* | 11/2013 | Yager | C23C 16/26 428/336 |
| 2014/0044885 | A1* | 2/2014 | Boyd | C23C 16/52 427/534 |
| 2015/0337458 | A1* | 11/2015 | Duan | C30B 25/186 428/220 |

OTHER PUBLICATIONS

X. Li, et al. publication entitled "Graphene films with large domain size by a two-step chemical vapor deposition process," Nano Lett., vol. 10, pp. 4328-4334 (2010).*

(Continued)

*Primary Examiner* — Kenneth A Bratland, Jr.
(74) *Attorney, Agent, or Firm* — Meunier Carlin & Curfman LLC

(57) ABSTRACT

A method of forming graphene single crystal domains on a carbon substrate is described.

30 Claims, 15 Drawing Sheets

(56) References Cited

OTHER PUBLICATIONS

H. Wang, et al. publication entitled "Controllable synthesis of submillimeter single-crystal monolayer graphene domains on copper foils by suppressing nucleation," J. Am. Chem. Soc., vol. 134, pp. 3627-3630 (2012).*
X. Li, et al. publication entitled "Graphene films with large domain size by a two-step chemical vapor deposition process," Nano Lett. , vol. 10, pp. 4328-4334 (2010).*
Alstrup, et al. publication entitled "The interaction of CH4 at high temperatures with clean and oxygen precovered Cu(100)," Surface Science, vol. 264, pp. 95-102 (1992).*
Ajayan et al., Graphene Pushing the Boundaries, Nat. Mater. 10:415-417, 2011.
Alstrup et al., The interaction of CH4 at high temperatures with clean and oxygen precovered Cu(100), Surf. Sci. 264:95-102, 1992.
Artyukhov et al., Equilibrium at the edge and atomistic mechanisms of graphene growth, Proc. Natl. Acad. Sci. USA, 109:15136-15140, 2012.
Bae et al., Roll-to-roll production of 30-in. graphene films for transparent electrodes, Nat. Nanotechnol. 5:574-578, 2010.
Bartelt et al., Graphene growth on metal surfaces, MRS Bulletin 37:1158-1165, 2012.
Bhaviripudi et al., Role of Kinetics Factors in Chemical Vapor Deposition Synthesis of Uniform Large Area Graphene Using Copper Catalyst, Nano Lett. 10:4128-4133, 2010.
Chen et al., Millimeter-Size Single-Crystal Graphene by Suppressing Evaporative Loss of Cu During Low Pressure Chemical Vapor Deposition, Adv. Mater. 25:2062-2065, 2013.
Chen et al., Contrasting Behavior of Carbon Nucleation in the Initial Stages of Graphene Epitaxial Growth on Stepped Metal Surfaces, Phys. Rev. Lett. 104:186101, 2010.
Chen, Phase-field models for microstructure evolution, Annu. Rev. Mater. Res. 32:113-377, 2002.
Dean et al., Boron nitride substrates for high-quality graphene electronics. Nat. Nanotechnol. 5:722, 2010.
Gao et al., Graphene Nucleation on Transition Metal Surface: Structure Transformation and Role of the Metal Step Edge, J. Am. Chem. Soc. 133:5009, 2011.
Hammer et al., Theoretical Surface Science and Catalysis—Calculations and Concepts, Adv. Catal. 45:71-129, 2000.
Han et al., Influence of copper morphology in forming nucleation seeds for graphene growth, Nano Lett. 11:4144-4148, 2011.
Hao et al., The Role of Surface Oxygen in the Growth of Large Single-Crystal Graphene on Copper,Science 342: 720-723, 2013.
Hwang et al. Carrier transport in two-dimensional graphene layers, Phys. Rev. Lett. 98, 186806, 2007.
Karma et al., Spiral Surface Growth without Desorption, Phys. Rev. Lett. 81:4444, 1998.
Kim et al., Activation Energy Paths for Graphene Nucleation and Growth on Cu, ACS Nano 6:3614-3623, 2012.
Li et al., Large-Area Synthesis of High-Quality and Uniform Graphene Films on Copper Foils, Science 324:1312-1314, 2009.
Li et al., Transfer of Large-Area Graphene Films for High-Performance Transparent Conductive Electrodes, Nano Lett. 9:4359-4363, 2009.
Li et al., Evolution of Graphene Growth on Ni and Cu by Carbon Isotope Labeling, Nano Lett. 9:4268-4272, 2009.
Li et al., Graphene Films with Large Domain Size by a Two-Step Chemical Vapor Deposition Process, Nano Lett. 10:4328-4334, 2010.
Li et al., Large-Area Graphene Single Crystals Grown by Low-Pressure Chemical Vapor Deposition of Methane on Copper, J. Am. Chem. Soc. 133:2816-2819, 2011.
Murdock et al., Controlling the Orientation, Edge Geometry, and Thickness of Chemical Vapor Deposition Graphene, ACS Nano 7:1351-1359, 2013.
Nie et al., Origin of the mosaicity in graphene grown on Cu(111), Phys. Rev. B 84:155425, 2011.
Petrone et al., Chemical Vapor Deposition-Derived Graphene with Electrical Performance of Exfoliated Graphene, Nano Lett. 12:2751-2756, 2012.
Santen et al., Reactivity Theory of Transition-Metal Surfaces: A Brønsted-Evans-Polanyi Linear Activation Energy—Free-Energy Analysis, Chem. Rev. 110:2005, 2009.
Starodub et al., Oxidation of Graphene on Metals. J. Phys. Chem. C 114:5134, 2010.
Suket al., Transfer of CVD-Grown Monolayer Graphene onto Arbitrary Substrates, ACS Nano 5:6916-6924, 2011.
Tsen et al., Tailoring Electrical Transport Across Grain Boundaries in Polycrystalline Graphene, Science, 336:1143-1146, 2012.
Vlassiouk et al., Role of Hydrogen in Chemical Vapor Deposition Growth of Large Single-Crystal, ACS Nano 5:6069-6076, 2011.
Wang et al., Controllable Synthesis of Submillimeter Single-Crystal Monolayer Graphene Domains on Copper Foils by Suppressing Nucleation, J. Am. Chem. Soc. 134:3627-3630, 2012.
Witten Jr et al., Diffusion-Limited Aggregation, a Kinetic Critical Phenomenon, Phys. Rev. Lett. 47:1400-1403, 1981.
Wu et al., Self-organized graphene crystal patterns. NPG Asia Materials, 5:e36, 2013.
Xing et al., C—H bond activation of methane on clean and oxygen precovered metals: A systematic theoretical study, J. Catal. 282:74-82, 2011.
Yan et al., Toward the Synthesis of Wafer-Scale Single-Crystal Graphene on Copper Foils, ACS Nano 6:9110-9117, 2012.
Yu et al., Control and characterization of individual grains and grain boundaries in graphene grown by chemical vapor deposition, Nat. Mater. 10:443, 2011.
Zhang et al., Atomistic Processes in the Early Stages of Thin-Film Growth, Science 276:377-383, 1997.
Zhang et al., First-Principles Thermodynamics of Graphene Growth on Cu Surfaces, J. Phys. Chem. C 115:17782-17787, 2011.

* cited by examiner

METHODS OF FORMING GRAPHENE SINGLE CRYSTAL DOMAINS ON A LOW NUCLEATION SITE DENSITY SUBSTRATE

BACKGROUND

Graphene is a one-atom-thick planar sheet of $sp^2$-bonded carbon atoms that are densely packed in a honeycomb crystal lattice. The carbon-carbon bond length in graphene is about 0.142 nm. Graphene is the basic structural element of some carbon allotropes including graphite, carbon nanotubes, and fullerenes.

Currently, graphene "single crystal" films can be produced by mechanical exfoliation (repeated peeling) of graphite crystals. However, graphene produced by this method is of very limited size (e.g., at most a few hundred micrometers on the side), very expensive, not scalable, and very difficult and impractical to implement in an industrial environment. Another method for producing graphene is to heat silicon carbide to high temperatures (e.g., much greater than 1,400° C.) to evolve silicon atoms preferentially from the silicon carbide surface to form a few layers of graphene. The layers of graphene in this case are crystallographically rotated with respect to each other such that the top layer behaves electrically as graphene rather than graphite. This process produces a sample size that is dependent upon the size of the silicon carbide substrate used. Furthermore, the quality of the graphene produced from this process degrades at the crystallographic step edges. The face of the silicon carbide used for graphene creation highly influences the thickness, mobility and carrier density of the graphene. One major disadvantage of the graphene synthesis on silicon carbide process is that even if it were scalable to large diameter crystals, it is not yet possible to use it for applications other than just on silicon carbide since exfoliation of the growth graphene from SiC is difficult. There are many situations where graphene needs to be integrated with other applications, such as silicon integrated circuits, transparent conductive electrodes for displays or photovoltaic devices, membranes, etc. In many of these applications the size can be on the order of meters squared.

Therefore, there is a need for the synthesis of standalone graphene films with properties equivalent to exfoliated graphene from natural graphite that is scalable to size far greater than that available on silicon carbide or from natural graphite. The subject matter disclosed herein addresses these and other needs.

SUMMARY

In accordance with the purposes of the disclosed methods, as embodied and broadly described herein, the disclosed subject matter, in one aspect, relates to compositions and methods of making and using the compositions. In a further aspect, the disclosed subject matter relates to methods of forming a graphene single crystal domain on a substrate, the graphene single crystal domain, and use of the single crystal domain.

In some examples, the disclosed methods comprise contacting the substrate with a passivating gas to create a low nucleation site density substrate and contacting the low nucleation site density substrate with a working gas at a first elevated temperature, thereby forming a graphene single crystal domain on the low nucleation site density substrate. In some examples, contacting the substrate with the passivating gas decreases the number of nucleating sites on the substrate by at least 50%.

In some examples, the density of nucleation sites on the low density nucleation substrate can be less than 1000 $mm^{-2}$. In some examples, the substrate is contacted with the passivating gas from 1 second to 20 minutes. In some examples, the passivating gas comprises oxygen.

In some examples, the low nucleation site density substrate is contacted with the working gas from 1 to 800 minutes. In some examples, the working gas is provided at a pressure of $1\times10^{-3}$ to $5\times10^{-2}$ Torr. In some examples, the working gas comprises a hydrocarbon gas. In some examples, the working gas comprises methane.

In some examples, the substrate comprises copper. In some examples, the graphene single crystal domain is substantially a single crystal. In some examples, the graphene single crystal domain is at least 100 micrometers (μm) in size. In some examples, the graphene single crystal domain is at least 1 centimeter (cm) in size. In some examples, the graphene single crystal domain is dendritic in shape.

Additional advantages will be set forth in part in the description that follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

DETAILED DESCRIPTION

Figure 1:
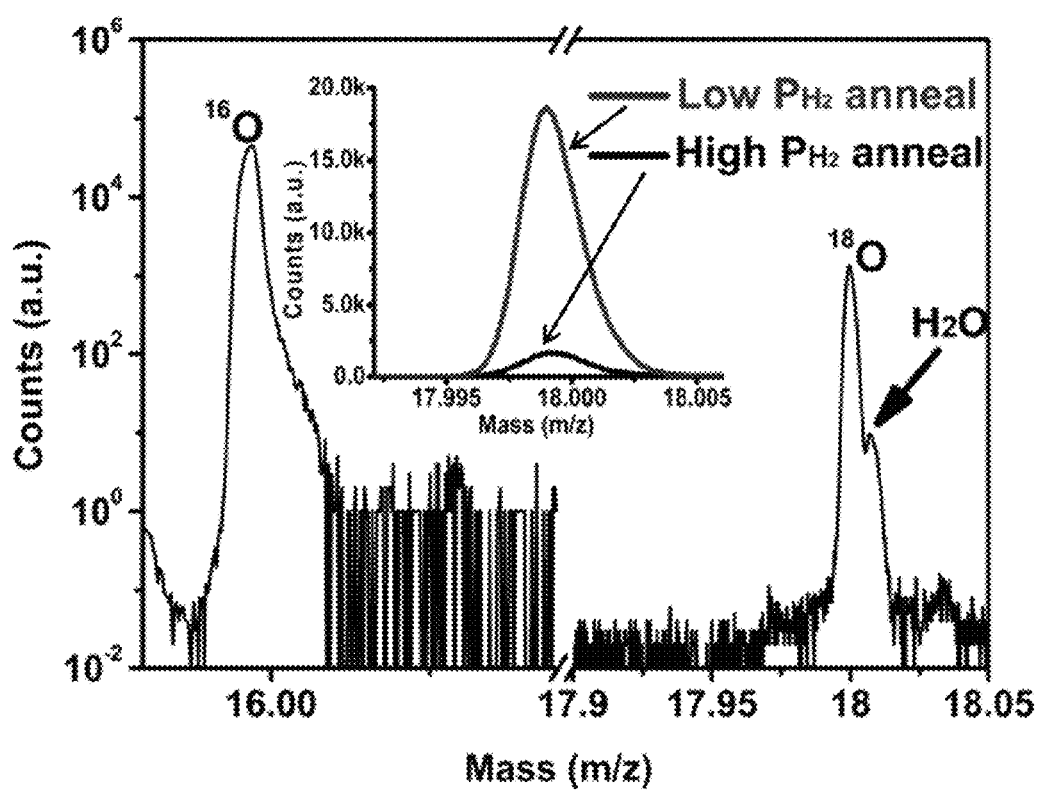
FIG. 1 is a graph showing TOF-SIMS surface measurements of oxygen free Cu (OF-Cu) foil with regular $^{16}O_2$ and $^{18}O_2$ exposure. The inset is the $^{18}O_2$ peak comparison between low and high $H_2$ pressure annealing, in which the $^{16}O$ peaks are scaled to have similar intensities.

The methods described herein may be understood more readily by reference to the following detailed description of specific aspects of the disclosed subject matter and the Examples included therein.

Before the present methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

General Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

As used herein, the term "graphene" and other forms of the word, such as "graphite" and "graphitic", is meant to refer to hexagonal carbon. As disclosed herein the graphene layers are said to be substantially pure. By substantially pure is meant that the graphene layer contains 1% or less (e.g., less than 0.5%, 0.25%, or 0.1%) of material other than carbon. Further, the graphene layers are said to be substantially free of amorphous carbon, which means that the graphene layer has less than 10% (e.g., less than 7%, 5%, 2.5%, or 1%) of the carbon in an amorphous or non-hexagonal configuration. The purity of the graphene can be determined using various techniques, i.e., by Raman spectroscopy, X-ray photoelectron spectroscopy (XPS), transmission electron spectroscopy (TEM), or any combination thereof.

Methods of Synthesis

Graphene grown by traditional chemical vapor deposition on metal surfaces tends to be polycrystalline with grain sizes ranging from a few hundred nanometers to a few hundred micrometers. A grain boundary is the interface between two grains, or crystallites, in a polycrystalline material. Grain boundaries are defects in the crystal structure, and tend to decrease the electrical and thermal conductivity of the material. Most grain boundaries are preferred sites for the onset of corrosion, for the precipitation of new phases from the solid, and may cause carrier scattering and thus electronic transport degradation.

Electronic devices are sensitive to grain boundaries. A single crystal growth process would be preferred in order to achieve the highest quality material possible. A single crystal or monocrystallite solid is a material in which the crystal lattice of the entire sample is continuous and unbroken to the edges of the sample, with no grain boundaries. The absence of defects associated with grain boundaries can give monocrystals unique properties, particularly mechanical, optical and electrical. These properties are industrially used in technological applications, especially in optics and electronics.

Because entropic effects favor the presence of some imperfections in the microstructure of solids, such as impurities, inhomogeneous strain and crystallographic defects such as dislocations, perfect single crystals of meaningful size are exceedingly rare in nature and are also difficult to produce in the laboratory, though they can be made under controlled conditions.

Disclosed herein are methods of forming large graphene single crystal domains on a metal substrate. In some examples, the graphene single crystal domain is synthesized through the use of a modified methane chemical vapor deposition (CVD) on a metal substrate. Prior to the methane CVD, the nucleation density of graphene on the metal surface can be decreased by passivating some of the nuclei or nucleating sites on the metal substrate. This passivation can be accomplished, for example, by exposing the metal substrate to a passivating gas.

A variety of chemical vapor apparatus can be used. A chemical vapor deposition apparatus typically comprises a horizontal tubular reactor equipped with a susceptor for mounting a substrate thereon, a heater for heating the substrate, a feed gas introduction portion arranged such that the direction of the feed gas fed in a tubular reactor is made parallel to the substrate, and a reaction gas exhaust portion. Thus the substrate is placed on the susceptor in the tubular reactor, the substrate is heated, and a gas containing a feed gas is supplied in the reactor in the direction parallel to the substrate so that a chemical vapor deposition forms a film on the substrate. See U.S. Pat. No. 6,926,920, U.S. Publication No. 2002-0160112, which are incorporated by reference herein for their teachings of CVD techniques. In some examples, the feed gas is a carbon precursor, for example, xylene, toluene, benzene, methane, ethane, ethylene, and the like. A carrier gas, such as a mixture of hydrogen and argon, can also be used.

Disclosed herein are methods of forming a graphene single crystal domain on a substrate. In some examples, the method comprises contacting the substrate with a passivating gas to create a low nucleation site density substrate and contacting the low nucleation site density substrate with a working gas at a first elevated temperature, thereby forming a graphene single crystal domain on the low nucleation site density substrate.

In some examples, contacting the substrate with the passivating gas decreases the number of nucleating sites on the substrate by at least a factor of 10 (e.g., at least a factor of 100, at least a factor of 1000, at least a factor of 1,000, or at least a factor of 10,000). In some examples, contacting the substrate with the passivating gas decreases the number of nucleating sites on the substrate by at least 50% (e.g., at least 55%, at least 65%, at least 70%, at least 75%, at least 80%, at least 85%, at least 90%, or at least 95).

The density of nucleation sites on a substrate can be related to the ultimate size of the graphene single crystal domain. In some examples, the density of nucleation sites on the low nucleation site density substrate can be less than 1000 $mm^{-2}$ (i.e., less than 1000 nucleation sites per millimeters squared of the low density nucleation substrate). In some examples, the density of nucleation sites on the low nucleation site density substrate can be, for example, less than 900 $mm^{-2}$, less than 800 $mm^{-2}$, less than 700 $mm^{-2}$, less than 600 $mm^{-2}$, less than 500 $mm^{-2}$, less than 400 $mm^{-2}$, less than 300 $mm^{-2}$, less than 200 $mm^{-2}$, less than 100 $mm^{-2}$, less than 90 $mm^{-2}$, less than 80 $mm^{-2}$, less than 70 $mm^{-2}$, less than 60 $mm^{-2}$, less than 50 $mm^{-2}$, less than 40 $mm^{-2}$, less than 30 $mm^{-2}$, less than 20 $mm^{-2}$, or less than 10 $mm^{-2}$.

The substrate can be contacted with the passivating gas for any amount of time sufficient to achieve the desired decrease in the number of nucleation sites on the substrate. In some examples, the substrate can be contacted with the passivating gas for at least 1 seconds (e.g., at least 10 seconds, at least 20 seconds, at least 30 seconds, at least 40 seconds, at least 50 seconds, at least 1 minute, at least 2 minutes, at least 3 minutes, at least 4 minutes, at least 5 minutes, at least 10 minutes, or at least 15 minutes). In some examples, the substrate can be contacted with the passivating gas for 20 minutes or less (e.g., 15 minutes or less, 10 minutes or less, 5 minutes or less, 1 minute or less, 30 seconds or less, 20 seconds or less, or 10 seconds or less). In some examples, the substrate can be contacted with the passivating gas for from 1 second to 20 minutes (e.g., from 10 seconds to 15 minutes, from 20 seconds to 10 minutes, from 30 seconds to 5 minutes, or from 1 minute to 4 minutes). In general, the longer the passivating gas is contacted with the substrate the greater the decrease in nucleation sites will be.

The substrate can be contacted with the passivating gas at any temperature consistent with the methods described herein. In some examples, the substrate can be contacted with the passivating gas at a temperature from room temperature up to within a few degrees of the melting temperature of the substrate. In some examples, the substrate can be contacted with the passivating gas at a temperature of at least 20° C. (e.g., at least 50° C., at least 100° C., at least 125° C., at least 150° C., at least 175° C., at least 200° C., at least 225° C., at least 250° C., or at least 275° C.). In some examples, the substrate can be contacted with the passivating gas at a temperature of 300° C. or less (e.g., 275° C. or less, 250° C. or less, 225° C. or less, 200° C. or less, 175° C. or less, 150° C. or less, 125° C. or less, 100° C. or less, or 50° C. or less). In some examples, the substrate can be contacted with the passivating gas at a temperature of 20° C.-300° C. (e.g. 50° C.-275° C., 100° C.-250° C., or 150° C.-225° C.).

In some examples, the passivating gas can be flowed at a rate of at least 1 sccm (e.g., at least 10 sccm, at least 20 sccm, at least 30 sccm, at least 40 sccm, at least 50 sccm, at least 60 sccm, at least 70 sccm, at least 80 sccm, at least 90 sccm, at least 100 sccm, at least 200 sccm, at least 300 sccm, at least 400 sccm, at least 500 sccm, at least 1000 sccm, at least 2000 sccm, at least 3000 sccm, at least 4000 sccm, at least 5000 sccm, at least 6000 sccm, at least 7000 sccm, at least 8000 sccm, or at least 9000 sccm). In some examples, the passivating gas can be flowed at a rate of 10,000 sccm or less (e.g., 9000 sccm or less, 8000 sccm or less, 7000 sccm or less, 6000 sccm or less, 5000 sccm or less, 4000 sccm or less, 3000 sccm or less, 2000 sccm or less, 1000 sccm or less, 900 sccm or less, 800 sccm or less, 700 sccm or less, 600 sccm or less, 500 sccm or less, 400 sccm or less, 300 sccm or less, 200 sccm or less, 100 sccm or less, 90 sccm or less, 80 sccm or less, 70 sccm or less, 60 sccm or less, 50 sccm or less, 40 sccm or less, 30 sccm or less, 20 sccm or less, or 10 sccm or less). In some examples, the passivating gas can be flowed at a rate of 1-10,000 sccm (e.g., 1-100 sccm, 100-9000 sccm, 200-8000 sccm, 300-7000 sccm, 400-6000 sccm, 500-5000 sccm, 600-4000 sccm, 700-3000 sccm, 800-2000 sccm, or 900-1000 sccm).

In some examples, the passivating gas can be provided at a pressure of at least $1\times10^{-6}$ Torr (e.g., at least $1\times10^{-5}$ Torr, at least $1\times10^{-4}$ Torr, at least $1\times10^{-3}$ Torr, at least $1\times10^{-2}$ Torr, at least 0.1 Torr, at least 1 Torr, at least 100 Torr, at least 200 Torr, at least 300 400 Torr, at least 500 Torr, at least 600 Torr, or at least 700 Torr). In some examples, the passivating gas can be provided at a pressure of 760 Torr or less (e.g., 700 Torr or less, 600 Torr or less, 500 Torr or less, 400 Torr or less, 300 Torr or less, 200 Torr or less, 100 Torr or less, 1 Torr or less, 0.1 Torr or less, $1\times10^{-2}$ Torr or less, $1\times10^{-3}$ Torr or less, $1\times10^{-4}$ Torr or less, or $1\times10^{-5}$ Torr or less). In some examples, the passivating gas can be provided at a pressure of $1\times10^{-6}$ to 760 Torr (e.g., $1\times10^{-5}$-700 Torr, $1\times10^{-4}$-600 Torr, $1\times10^{-3}$-500 Torr, $1\times10^{-2}$-400 Torr, 0.1-300 Torr, or 1-200 Torr).

The passivating gas can be any gas capable of decreasing the number of nucleation sites on the substrate. In some examples, the passivating gas comprises oxygen, chlorine, fluorine, sulfur, selenium, or combinations thereof. In some examples, the passivating gas comprises oxygen.

The low nucleation site density substrate can be contacted with the working gas for any amount of time sufficient to grow the desired graphene single crystal domain. In some examples, the low nucleation site density substrate can be contacted with the working gas for at least 1 minute (e.g., at least 10 minutes, at least 20 minutes, at least 40 minutes, at least 60 minutes, at least 80 minutes, at least 100 minutes, at least 200 minutes, at least 300 minutes, at least 400 minutes, at least 500 minutes, at least 600 minutes, or at least 700 minutes). In some examples, the low density nucleation substrate can be contacted with the working gas for 800 minutes or less (e.g., 700 minutes or less, 600 minutes or less, 500 minutes or less, 400 minutes or less, 300 minutes or less, 200 minutes or less, or 100 minutes or less). In some examples, the low nucleation site density substrate can be contacted with the working gas for from 1 to 800 minutes (e.g., from 10 to 750 minutes, from 50 to 700 minutes, from 100 to 650 minutes, from 150 to 600 minutes, from 200 to 550 minutes, from 250 to 500 minutes, from 300 to 450 minutes, or from 350 to 400 minutes).

The working gas can be contacted with the low nucleation site density substrate at any temperature sufficient to decompose the working gas. In some examples, the working gas can be contacted with the low nucleation site density substrate at a temperature of at least 300° C. (e.g., at least 400° C., at least 500° C., at least 600° C., at least 700° C., at least 800° C., at least 900° C., or at least 1000° C.). In some examples, the working gas can be contacted with the low nucleation site density substrate at a temperature of 1080° C. or less (e.g., 1000° C. or less, 900° C. or less, 800° C. or less, 700° C. or less, 600° C. or less, 500° C. or less, or 400° C. or less). In some examples, the working gas can be contacted with the low nucleation site density substrate at a temperature of 300° C.-1080° C. (e.g., 350-1050° C., 400-1000° C., 450-950° C., 500-900° C., 550-850° C., 600-800° C., or 650-750° C.).

In some examples, the working gas can be flowed at a rate of at least 1 sccm (e.g., at least 10 sccm, at least 20 sccm, at least 30 sccm, at least 40 sccm, at least 50 sccm, at least 60 sccm, at least 70 sccm, at least 80 sccm, at least 90 sccm, at least 100 sccm, at least 200 sccm, at least 300 sccm, at least 400 sccm, at least 500 sccm, at least 1000 sccm, at least 2000 sccm, at least 3000 sccm, at least 4000 sccm, at least 5000 sccm, at least 6000 sccm, at least 7000 sccm, at least 8000 sccm, or at least 9000 sccm). In some examples, the working gas can be flowed at a rate of 10,000 sccm or less (e.g., 9000 sccm or less, 8000 sccm or less, 7000 sccm or less, 6000 sccm or less, 5000 sccm or less, 4000 sccm or less, 3000 sccm or less, 2000 sccm or less, 1000 sccm or less, 900 sccm or less, 800 sccm or less, 700 sccm or less, 600 sccm or less, 500 sccm or less, 400 sccm or less, 300 sccm or less, 200 sccm or less, 100 sccm or less, 90 sccm or less, 80 sccm or less, 70 sccm or less, 60 sccm or less, 50 sccm or less, 40 sccm or less, 30 sccm or less, 20 sccm or less, or 10 sccm or less). In some examples, the working gas can be flowed at a rate of 1-10,000 sccm (e.g., 1-100 sccm, 100-9000 sccm, 200-8000 sccm, 300-7000 sccm, 400-6000 sccm, 500-5000 sccm, 600-4000 sccm, 700-3000 sccm, 800-2000 sccm, or 900-1000 sccm).

The working gas can be provided at any pressure sufficient to achieve the desired graphene single crystal domain. In some examples, the working gas can be provided at a pressure of at least $1\times10^{-6}$ Torr (e.g., at least $1\times10^{-5}$ Torr, at least $1\times10^{-4}$ Torr, at least $1\times10^{-3}$ Torr, at least $1\times10^{-2}$ Torr, at least 0.1 Torr, at least 1 Torr, at least 100 Torr, at least 200 Torr, at least 300 400 Torr, at least 500 Torr, at least 600 Torr, or at least 700 Torr). In some examples, the passivating gas can be provided at a pressure of 760 Torr or less (e.g., 700 Torr or less, 600 Torr or less, 500 Torr or less, 400 Torr or less, 300 Torr or less, 200 Torr or less, 100 Torr or less, 1 Torr or less, 0.1 Torr or less, $1\times10^{-2}$ Torr or less, $1\times10^{-3}$ Torr or less, $1\times10^{-4}$ Torr or less, or $1\times10^{-5}$ Torr or less). In some examples, the passivating gas can be provided at a pressure of $1\times10^{-6}$ to 760 Torr (e.g., $1\times10^{-5}$-700 Torr, $1\times10^{-4}$-600 Torr, $1\times10^{-3}$-500 Torr, $1\times10^{-2}$-400 Torr, 0.1-300 Torr, or 1-200 Torr).

In some examples, the working gas can comprise a hydrocarbon gas. Suitable examples of hydrocarbon gases include, but are not limited to, ethylene, acetylene, methane, benzene, toluene or a combination thereof. In some examples, the hydrocarbon material can be a liquid at room temperature that is delivered to the substrate by vaporizing it and transporting it to the substrate. For example, the hydrocarbon liquid can be ethane, hexane, heptanes, octane, etc. In some examples, the working gas comprises methane. In some examples, the working gas comprises methane and hydrogen.

The substrate can be any substrate on which a graphene single crystal domain can be grown. In some examples, the substrate can comprise a metal. The metal can be a metal foil. Examples of suitable metals include, but are not limited to, ruthenium, iridium, copper, nickel, or combinations thereof. In some examples, the substrate comprises copper. In some examples, the copper is oxygen rich, meaning it contains at least $10^{-2}$ atomic % oxygen. In some examples, the copper is oxygen free, meaning it contains less than $10^{-6}$ atomic % oxygen.

In some examples, the substrate can comprise a dielectric substance coated with a metal. For example, the substrate can comprise a wafer coated with a metal. In some other examples, the wafer can comprise a semiconductor wafer, an insulator wafer, or combinations thereof. In some examples, the substrate can comprise a Si wafer coated with a metal.

In some examples, the substrate further comprises a non-reacting layer. In some examples, the non-reacting layer can comprise silicon dioxide, aluminum dioxide, or combinations thereof. In some examples, the non-reacting layer can be deposited over the metal to reduce evaporation of the metal, for example, at high temperatures.

In some examples, the graphene single crystal domain can be at least 100 micrometers (μm) in size (e.g., at least 200 μm, at least 300 μm, at least 400 μm, at least 500 μm, at least 600 μm, at least 700 μm, at least 800 μm, at least 900 μm, at least 1 millimeter (mm), 10 mm, at least 20 mm, at least 30 mm, at least 40 mm, at least 50 mm, at least 60 mm, at least 70 mm, at least 80 mm, at least 90 mm, or at least 1 centimeter).

In some examples, the graphene single crystal domain density on the low nucleation site density substrate can be 100 $mm^{-2}$ or less (i.e., there are 100 or less graphene single crystal domains per square millimeter of the low density nucleation substrate). For example, the graphene single crystal domain density of the low density nucleation substrate can be 90 $mm^{-2}$ or less, 80 $mm^{-2}$ or less, 70 $mm^{-2}$ or less, 60 $mm^{-2}$ or less, 50 $mm^{-2}$ or less, 40 $mm^{-2}$ or less, 30 $mm^{-2}$ or less, 20 $mm^{-2}$ or less, or 10 $mm^{-2}$ or less.

In some examples, the graphene single crystal domain can be dendritic in shape. In some examples, the graphene single crystal domain can be compact with straight edges.

In some examples, the method can further comprise an annealing step. The annealing step can, for example, be used to desorb any unwanted contaminants from the surface of the substrate, stabilize the microstructure of the substrate, or combinations thereof. In some examples, the annealing step can occur before the substrate is contacted with the passivating gas. In some examples, the annealing step comprises contacting the substrate with an annealing gas at a second elevated temperature.

The substrate can be contacted with the annealing gas for any amount of time sufficient to achieve the desired substrate surface properties. In some examples, the substrate can be contacted with the annealing gas for at least 1 second (e.g., at least 30 seconds, at least 1 minute, at least 10 minute, at least 20 minutes, at least 30 minutes, at least 40 minutes, at least 50 minutes, at least 60 minutes, at least 70 minutes, at least 80 minutes, or at least 90 minutes). In some examples, the substrate can be contacted with the annealing gas for 100 minutes or less (e.g., 90 minutes or less, 80 minutes or less, 70 minutes or less, 60 minutes or less, 50 minutes or less, 40 minutes or less, 30 minutes or less, 20 minutes or less, 10 minutes or less, or 1 minute or less). In some examples, the substrate can be contacted with the annealing gas for from 1 second to 100 minutes (e.g., from 1 to 95 minutes, from 10 to 90 minutes, from 20 to 85 minutes, from 30 to 80 minutes, from 40 to 75 minutes, or from 50 to 70 minutes). In some examples, the substrate can further comprise a non-reacting layer, such as, for example, silicon dioxide or aluminum dioxide. The non-reacting layer can, for example, help reduce evaporation of the substrate at high temperatures.

The annealing gas can be provided at any pressure sufficient to achieve the desired substrate surface properties. In some examples, the annealing gas can be provided at a pressure of at least $1\times10^{-6}$ Torr (e.g., at least $1\times10^{-3}$ Torr, at least 1 Torr, at least 10 Torr, at least 50 Torr, at least 100 Torr, at least 200 Torr, at least 300 Torr, at least 400 Torr, at least 500 Torr, at least 600 Torr, or at least 700 Torr). In some examples, the annealing gas can be provided at a pressure of 760 Torr or less (e.g., 700 Torr or less, 600 Torr or less, 500 Torr or less, 400 Torr or less, 300 Torr or less, 200 Torr or less, 100 Torr or less, 50 Torr or less, or 1 Torr or less). In some examples, the annealing gas can be provided at a pressure of $1\times10^{-6}$-760 Torr (e.g., 1-700 Torr, 50-600 Torr, 100-500 Torr, or 200-400 Torr).

The annealing step can occur at any second elevated temperature sufficient to achieve the desired substrate surface properties. In some examples, the second elevated temperature can be at least 1000° C.

The annealing gas can comprise any gas suitable for achieving the desired substrate surface properties. In some examples, the annealing gas comprises hydrogen.

Also disclosed herein are methods of forming a graphene single crystal domain, comprising: contacting an oxygen rich substrate having nucleation sites with a working gas at an elevated temperature, wherein the density of nucleation sites on the oxygen rich substrate can be less than 100 $mm^{-2}$, thereby forming a graphene single crystal domain on the oxygen rich substrate.

Also disclosed herein are methods of forming a graphene single crystal domain, comprising: contacting a low nucleation site density substrate with a working gas at an elevated temperature, wherein the density of nucleation sites on the low nucleation site density substrate can be less than 100 mm$^{-2}$, thereby forming a graphene single crystal domain on the oxygen rich substrate.

By the methods disclosed herein, a passivating gas like oxygen is used to decrease the graphene nucleation density by passivating surface active sites (i.e., nucleation sites) on substrates like copper. This allows repeatable growth of centimeter scale single crystal graphene single crystal domains on the substrate. Oxygen, in particular, was also found to accelerate the graphene single crystal domain growth rate and shift the growth kinetics from edge-attachment limited to diffusion-limited. Correspondingly, the compact graphene domain shapes become dendritic. The electrical quality of the graphene films is equivalent to mechanically exfoliated graphene, in spite of being grown in the presence of oxygen.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in °C. or is at ambient temperature, and pressure is at or near atmospheric. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

It is shown that oxygen on the Cu surface not only suppresses graphene nucleation, fostering growth of ultra-large single crystal graphene domains, but also changes the growth kinetics, which shifts the graphene domain shapes from compact to dendritic. First principles calculations and phase field simulations were also performed to provide insight into the growth mechanism and to reproduce the observed domain shapes.

Cu Foil Pretreatment, Graphene Growth, and Graphene Transfer

Commercially available Cu foils, both 'oxygen-free copper' (OF-Cu; such as, Alfa-Aesar stock#42972, #46986) and 'oxygen-rich copper' (OR-Cu; such as, Alfa-Aesar stock#46365, #13382), have thick native surface oxide layers and other impurities. In order to remove the surface contaminants and the surface oxide, Cu foils were chemically etched in acetic acid (CH$_3$COOH) for 8 hours followed by blow-drying with nitrogen gas, and then loaded into a tube furnace within 5 minutes to avoid surface oxidation.

Graphene growth was carried out in a low pressure CVD (LPCVD) system. After cleaning, the Cu foils were made in the form of a partially sealed pocket and loaded into the quartz tube. The system was then heated to 1035° C. under a H$_2$ flow of 10 cm$^3$ per min (sccm), corresponding to 1×10$^{-1}$ Torr, and annealed for from 20 to 100 min; CH$_4$ was then introduced into the system for graphene growth. The typical P$_{CH4}$ ranged from 1×10$^{-3}$ to 5×10$^{-2}$ Torr, and the growth time was varied from 10 to 800 min. For O$_2$ assisted growth, pure O$_2$ was used before growth for exposure times ranging from 10 s to 5 min, and a corresponding P$_{O2}$ is ~1×10$^{-3}$ Torr. After growth, the system was cooled down to room temperature while still under the H$_2$ and CH$_4$ flow. The graphene domains/films formed on the inner surface of the Cu pockets were characterized and analyzed.

The graphene domains/films were transferred onto dielectric surfaces (SiO$_2$ or hexagonal boron nitride (h-BN)) using a poly(methyl methacrylate) (PMMA)-assisted method (Suk et al. ACS Nano, 2011, 5, 6916) for Raman characterization and electrical device fabrication. Prior to transfer from the Cu, the graphene surface was spin-coated with a layer of PMMA to provide mechanical support for the graphene throughout the transfer process. The Cu/graphene/PMMA stack was then floated over an aqueous solution of ammonium persulfate ((NH$_4$)$_2$S$_2$O$_8$, 0.5 M, Sigma Aldrich) to etch the Cu. The resulting graphene/PMMA membranes were thoroughly rinsed with deionized water, and then transferred onto target substrates. The PMMA was removed with acetone, and then rinsed in isopropanol, and finally blow dried with nitrogen gas.

Control Experiments and Analyses Used to Confirm the Effect of Oxygen (1) $^{18}$O-Labeling Experiment The presence of oxygen and its stability on the Cu surface under the LPCVD conditions was confirmed by $^{18}$O-labeling. OF-Cu foils were loaded in the CVD system and heated to 1000° C. under H$_2$ (g), then the foils were exposed to $^{18}$O$_2$ (g) for 5 minutes at P$_{O2}$=1×10$^{-3}$ Torr followed by low H$_2$ pressure (P$_{H2}$=~0.1 Torr) or alternatively high pressure (P$_{H2}$=~10 Torr) annealing for another 90 minutes. After cool down, the foils were transferred from the CVD system to a TOF-SIMS instrument for analysis. The $^{18}$O concentration (mass peak intensity) for low pressure annealing is more than one order of magnitude higher than that after high pressure annealing, the latter is similar to the natural abundance of $^{18}$O (FIG. 1 and inset). This experiment shows that oxygen species on the Cu surface are not completely removed in the LPCVD process. The corresponding graphene growth results are described in (2) and (3) of this section.

The effects of H$_2$ pressure were also investigated. In each of the following growths, numbered (2)-(4), OF-Cu and OR-Cu were placed side-by-side in the growth system.

(2) Low P$_{H2}$ Annealing and then Growth.

Figure 2:
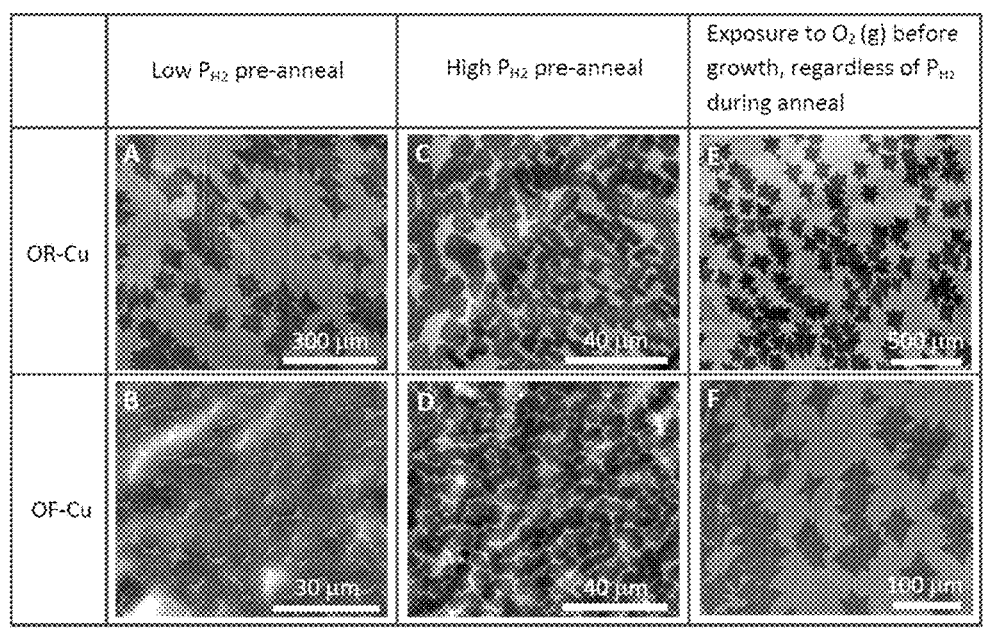
FIG. 2 shows growth results of graphene under different Cu substrates and annealing conditions. The growth parameters are the same: $P_{CH4}=5\times10^{-3}$ Torr, $P_{H2}=0.1$ Torr, T=1035° C., growth time 30 minutes. Note that in E and F, the $P_{H2}$ is 0.1 Torr before exposure to $O_2$ (g).

Both foils were annealed in low pressure H$_2$ (flow rate: 10 sccm, pressure: 0.1 Torr) at 1035° C. for 30 minutes, and then CH$_4$ (flow rate: 0.5 sccm, pressure: 5×10$^{-3}$ Torr) was added. The resulting graphene domain shapes were: 'multi-branched' on OR-Cu and 'compact' on OF-Cu, as shown in FIGS. 2A and B.

(3) High P$_{H2}$ Annealing and then Growth.

High pressure H$_2$ (flow rate: 1000 sccm, pressure: 10 Torr) annealing at 1035° C. for 60 minutes, followed by exposure to CH$_4$ (5×10$^{-3}$ Torr) and H$_2$ (0.1 Torr) for 30 minutes. Dense and compact domains were observed on both OR-Cu and OF-Cu, as shown in FIGS. 2C and D. This high pressure H$_2$ annealing is thus believed to completely remove oxide species, eliminating the effect of oxygen.

(4) Exposure to O$_2$ (g) Prior to Growth.

H$_2$ (0.1~10 Torr) annealing was performed at 1035° C. for 100 minutes, and then exposure to oxygen (0.1 sccm, 1×10$^{-3}$ Torr) for 20 seconds, after which H$_2$ (0.1 Torr) and CH$_4$ (5×10$^{-3}$ Torr) were introduced for 30 minutes. Multi-branched graphene domains were observed on both OR-Cu and OF-Cu, as shown in FIGS. 2E and F.

Graphene grows on Cu by a surface mediated process. Therefore, chemical specie(s) on the Cu surface were considered as candidate(s) for the domain shape effect. From the above experimental comparisons, oxygen, either segregated out of OR-Cu bulk or introduced from $O_2$ (g), was found to be strongly relevant to the observed density of nuclei and domain shapes. It was therefore concluded that oxygen plays a role in the nucleation and growth of graphene on Cu.

(5) Cu Foil Tube Vs. Cu Foil Pocket

Figure 3:
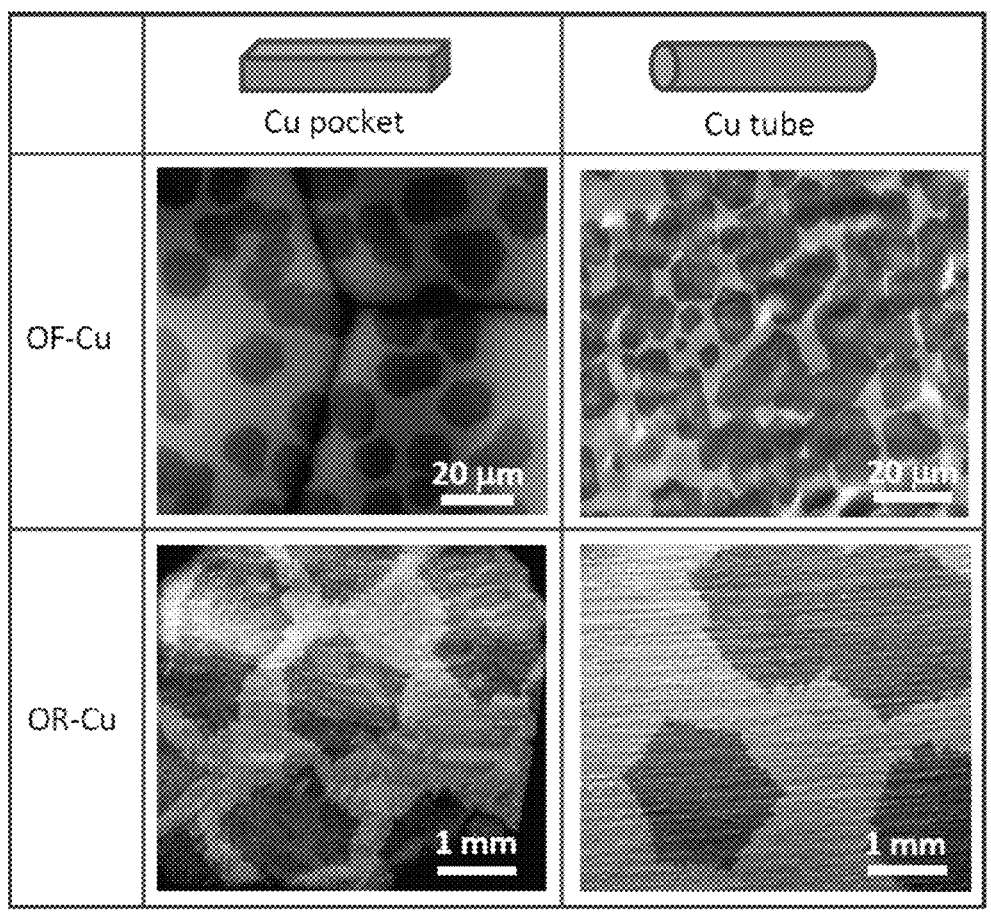
FIG. 3 shows a growth result comparison between inner surface of Cu pocket and inner surface of Cu tube under the same growth conditions.

Graphene crystals with a domain size of 2 mm can be grown on the inner surface of a Cu tube (Cu foil rolled into a cylinder with a given diameter) (Chen et al. Adv. Mater., 2013, 25, 2062). Herein, both OF-Cu and OR-Cu foil pockets and tubes were used to grow graphene under the same growth conditions. Typical geometry for the tube was 5 cm in length and 5 mm in diameter and the growth conditions were: $P_{H2}$=0.1 Torr and $P_{CH4}$=1×10$^{-3}$ Torr (flow rate: 0.1 sccm). The exposure time to $CH_4$ (g) was 3.5 hours for OR-Cu, and 40 minutes for OF-Cu. As shown in FIG. 3, the graphene grown inside the Cu tube and inside the Cu pocket are similar for OR-Cu and OF-Cu. The primary difference in the domain size and shape in this experiment can be attributed to the presence of oxygen.

(6) Effect of Adsorbed Carbon Species on Cu Surface

Figure 4:
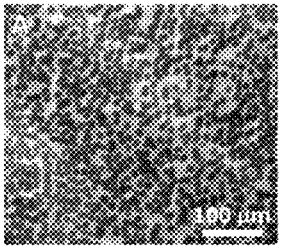
FIG. 4 shows experimental comparison between different Cu pretreatment steps on OF-Cu, and shows that the nucleation density can be either high or low depending on the surface oxygen.
Figure 5:
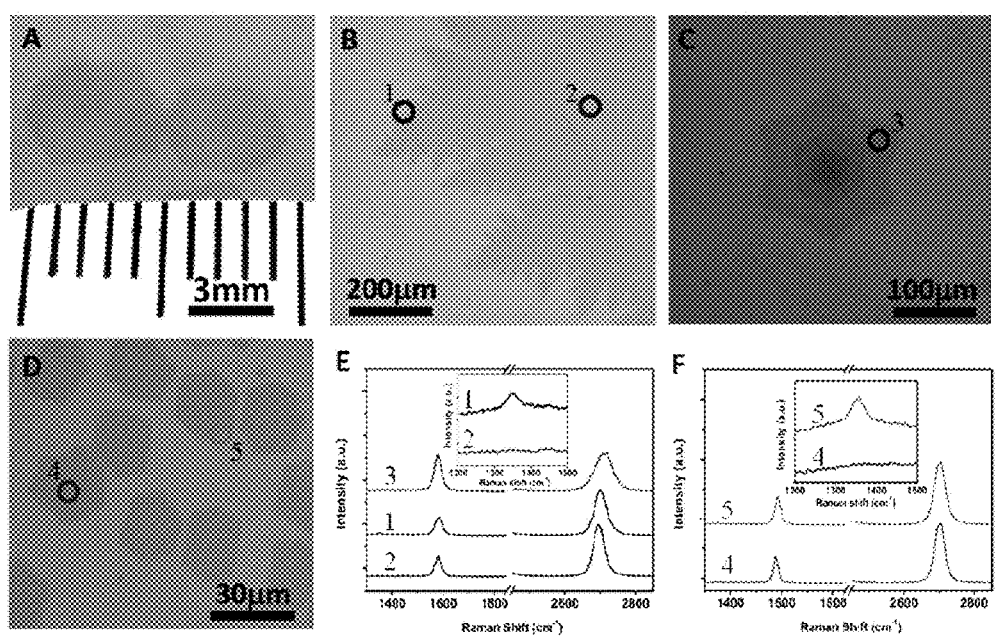
FIG. 5 shows optical images and Raman spectra of large-dendritic and small-compact graphene domains. A-C are the optical images of large graphene domains, domain edge, and domain center on $SiO_2/Si$ substrates, respectively. D is an optical image of compact hexagonal domains. E are Raman spectra at different positions (open circles of different numbers) of large graphene domains. Inset is the comparison of D peaks from the inner and edge positions of the domain. F are Raman spectra at different positions (open circles of different numbers) of compact graphene domains. The inset is the comparison of D peaks from the inner and edge positions of the domains.

Control experiments were also performed to determine whether the presence of carbon adsorbates on the Cu surface have a controlling effect on graphene nucleation. If carbon species adsorbed on Cu surface were responsible for nucleation of graphene, the nucleation density on OF-Cu should be significantly reduced after exposure to $O_2$ (g). However, as shown in FIG. 4C, the high nucleation density on OF-Cu is recovered after annealing in $H_2$ (g), similar to that before exposure to $O_2$ (g). This strongly suggests that Cu surface imperfections, such as step edges, kinks, etc., are preferential nucleation sites and not carbon adsorbates.

Raman Spectra of Graphene Domains

A 488 nm excitation laser with a 100× objective lens in WITec Alpha 300 micro-Raman imaging system was used for acquisition of Raman spectra and maps of the graphene domains/films.

Both compact and dendritic graphene domains were transferred onto Si substrates with 285 nm thick thermal oxide, as shown in FIG. 5A-D. The uniform brightness and contrast in optical images suggest that the domains have a uniform thickness. The Raman spectra show that the domains are single layer graphene with weak D peaks present only at the edges of each domain. In addition, small multi-layer regions are found near the center of the large graphene domains, as shown in the optical image of FIG. 5C, and also evidenced by broader Raman 2D peak (FIG. 5E). The multi-layer area was less than 1% of the total domain area.

Raman Mapping and Area Growth Rate Calculations

The area growth rate (coverage rate, dθ/dt) of graphene films on Cu can be obtained from carbon isotope labeled growth and Raman mapping. As shown in FIGS. 6A and B, the Raman 2D (also referred to as G') peak intensity maps of continuous graphene films on both OF-Cu and OF-Cu exposed to $O_2$ (OF-Cu (O)) reveal the progress of the whole growth process with time until full coverage (100%). The growth conditions were: $P_{CH4}$=2×10$^{-3}$ Torr (flow rate: 0.2 sccm), T=1035° C., growth time 90 minutes for OF-Cu, and 180 minutes for OF-Cu (O), $O_2$ (g) exposure at 1×10$^{-3}$ Torr for 30 s (as per FIG. 7B). The surface coverage (θ) can thus be extracted from the maps and plotted as a function of growth time (FIG. 6C, left plots). The plot from OF-Cu (O) was calculated with an area greater than 500 μm×500 μm to avoid any non-uniformity in θ at the local region. The θ in both cases is non-linear, as shown in the left plots of FIG. 6C. The time to full surface coverage on OF-Cu (O) is found to be twice as long as that on bare OF-Cu. Moreover, at any time of the growth of the film, coverage on OF-Cu is always higher than that on OF-Cu (O). This is reasonable since the low nucleation density on OF-Cu (O) leads to low coverage.

Figure 6:
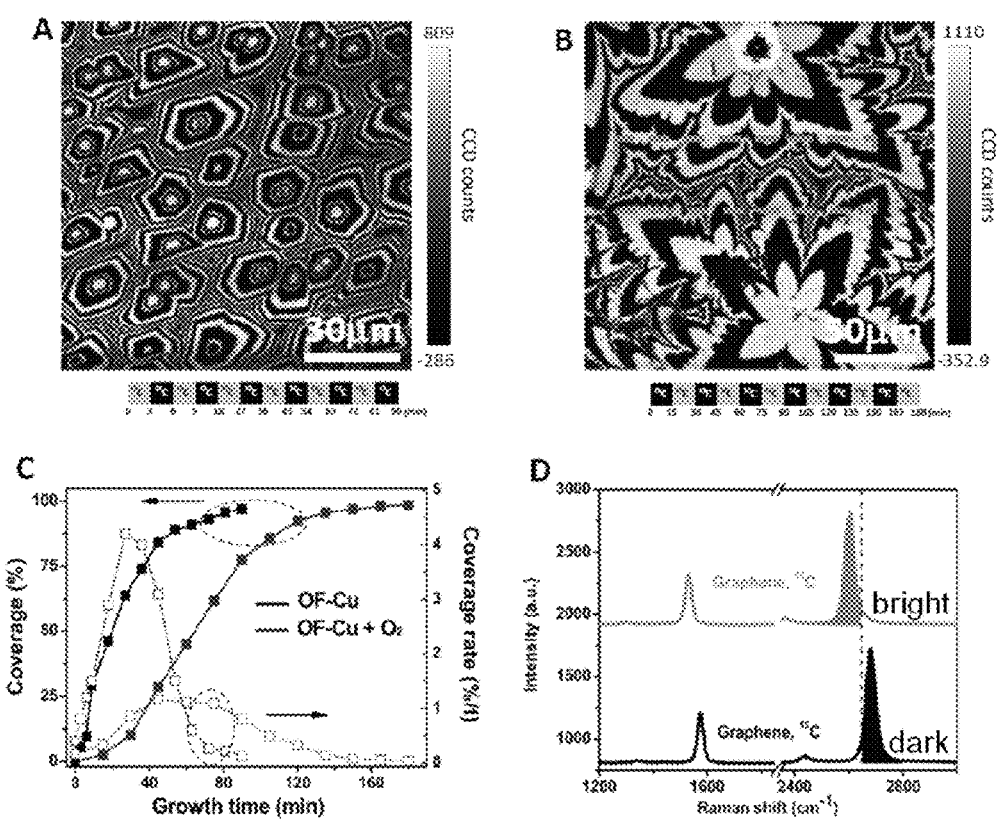
FIGS. 6A and B show Raman 2D band intensity maps of graphene films grown on OF-Cu and OF-Cu (O), respectively. The dashed box in B highlights the region corresponding to decelerating growth. C shows the surface coverage (solid lines) and surface coverage rate (dashed lines) on OF-Cu and OF-Cu (O), respectively, as a function of growth time at $P_{CH4}=2\times10^{-3}$ Torr. D are Raman spectra of graphene with $^{12}C$ (normal $CH_4$ was used) or $^{13}C$, and illustrate that the Raman maps are from the intensity of the 2D bands, as indicated with the filled areas. The top and bottom plots correspond to the bright and dark areas, respectively, in the Raman maps.

To further elucidate this, calculations were carried out. As shown in FIG. 8A-B, and FIG. 6, the samples were grown under the same conditions on either OF-Cu or OF-Cu (O). The nucleation density, N, is 2.3×10$^{-3}$ μm$^{-2}$ for OF-Cu, two orders of magnitude higher than that for OF-Cu (O), ~2.4× 10$^{-5}$ μm$^{-2}$. The radial growth rate, dr/dt, for OF-Cu is about 10 times lower than that for OF-Cu (O) during the first 32 minutes. According to the relation: N×dr/dt=θ, the coverage, θ, for OF-Cu case is therefore one order of magnitude higher than that for OF-Cu (O), consistent with the experimental results for the first 32 min growth (FIG. 6C). To summarize, low N leads to low θ even though the radial growth rate of individual domain is higher due to oxygen.

The corresponding dθ/dt is obtained by differentiating the surface coverage with respect to time, as shown in FIG. 6C (plots on the right). Two stages, accelerating and then decelerating growth, are observed in both cases (OF-Cu (O) and OF-Cu). In the early growth stage, the distance between neighboring graphene domains is larger than the diffusion length of carbon species, so that the growth of any single domain is not influenced by the existence of the others, and dθ/dt increases with domain edge length, i.e., domain perimeter. Later, at the decelerating stage, each domain grows under the influence of its neighbors, and the dθ/dt rate is thereby decreased until full coverage, a typical example being the dashed rectangle in FIG. 6B. In the Results and Discussion section, the calculation of individual domain growth rates and the analysis is limited to the early growth periods to consider growth free of inter-domain competition.

Activation Energy Calculations

Before inter-domain competition occurs, the radial growth rates (dr/dt) of individual graphene domains are nearly constant along a given crystal orientation, as revealed by isotope labeled growth in FIG. 9A-J. It is therefore possible to investigate the radial growth rates of individual domains as a function of temperature. In this work, the average radial growth rate d̄r/dt was used, and the crystal orientation effect was ignored. As illustrated in FIG. 9K, individual graphene domains with different shapes are converted into circular shapes of the same area. Because of the nearly constant radial growth rate, the circular shapes can also be drawn as concentric circles with equidistant radii (the radial lengths at given time spans). The corresponding radial growth rate is defined as d̄r/dt.

Low Energy Electron Microscopy, Photoelectron Emission Microscopy, and Low Energy Electron Diffraction Low energy electron microscopy (LEEM), photoelectron emission microscopy (PEEM), and low energy electron diffraction (LEED) were performed using an Elmitec LEEM III instrument. The as-grown graphene samples were transferred and loaded into the LEEM instrument, and then degassed at 250° C. overnight in ultra-high vacuum (base pressure <2×10$^{-10}$ Torr). The measurements were taken at room temperature. A Hg lamp (energy <5 eV) was used to generate the PEEM images, whose field of view (normally 140 μm) is greater than the largest field of view available in LEEM (75 μm). Selected-area LEED was typically obtained from 2 μm diameter regions of the surface.

Phase Field Simulations (1) Simulation Method Summary

In a phase-field model, an order parameter (phase field) varies smoothly between multiple phases with a diffused interface of finite width. In this simulation of graphene growth patterns, the phase-field model consists of an order parameter ψ and a concentration field ξ. On the Cu substrate ψ=−1, and on the graphene layer ψ=1. For the concentration u of the carbon species arriving on the Cu substrate, the field is u=Γ(ξ−ξ$_{eq}$), where Γ is the atomic area of the solid and ξ$_{eq}$ is the equilibrium concentration of the carbon species on the surface. The free energy functional G is based on that given by Karma and Plapp (Karma, A; Plapp, M. *Phys. Rev. Lett.*, 1998, 81, 4444) and can be expressed as:

$$G = \oint \kappa^2 (\nabla \psi)^2 - \frac{1}{\pi} \cos(\pi[\psi - \psi_0]) + \varphi \xi \left\{ \psi + \frac{1}{\pi} \sin(\pi[\psi - \psi_0]) \right\} \quad (1)$$

The growth equations for ψ and u are written as:

$$\tau_\psi \frac{d\psi}{dt} = -\frac{\delta G}{\delta \psi} \quad (2)$$

$$\frac{d\xi}{dt} = D\nabla^2 \xi + F - \frac{1}{2}\frac{d\psi}{dt} \quad (3)$$

$\kappa^2$ is the gradient energy term and the anisotropy of the graphene step energy is included in this term as $\kappa^2 = k^2 \{1 + \varepsilon_g \cos(n\theta)\}$, where $k^2$ is the constant average interface energy density, $\varepsilon_g$ is the strength of the anisotropy and n corresponds to the symmetry (for six-fold anisotropy, n=6). The characteristic time of attachment of the carbon species is $\tau_\psi$, the mean life time of the species on the surface is $\tau_s$, with $\tau_\psi \ll \tau_s$. The flux of the carbon species arriving at the surface is F, φ is a dimensionless coupling constant and D is the diffusion coefficient of the carbon species. The minima of the free energy G are at ψ−ψ$_0$=2m+1, where m is an integer, and are independent of u. The growth morphology of graphene is controlled by the competition among a few parameters, such as the characteristic time of attachment $\tau_\psi$, the flux F and the diffusion coefficient D (D is fixed herein), but its symmetry is controlled by the graphene edge energy, that is, six-fold on Cu(111).

The evolution equations are solved for the order parameter ψ(x, y, t) and concentration field ξ (Equations 2-3) using the discrete Fourier transform method with periodic boundary conditions in the in-plane (x and y) directions. The length and time are scaled in phase-field units, i.e., length using $\kappa^2$=1 and time is measured in units of $\tau_\psi$. Using Δx=Δy=1 and Δt=0.01, the equations are discretized in both space and time and the system cell sizes are: 256×256 for FIG. 10K; 512×512 for FIG. 10L-M and FIG. 11A-B; and 1024×1024 for FIG. 10N. The other parameters used were D=6, $k^2$=2, $\varepsilon_g$=0.01, $u_{eq}$=ξ(x, y, 0)=0.5, $\tau_s$=1000000.0 and φ=10. A circular nucleus of radius 10 was the starting point. Simulations were carried out at different values of F and $\tau_\psi$ and compared with the experiments.

(2) Domain Shape Diversity from Changes in Carbon Flux (F) and Characteristic Attachment Time ($\tau_\psi$).

Figure 10:
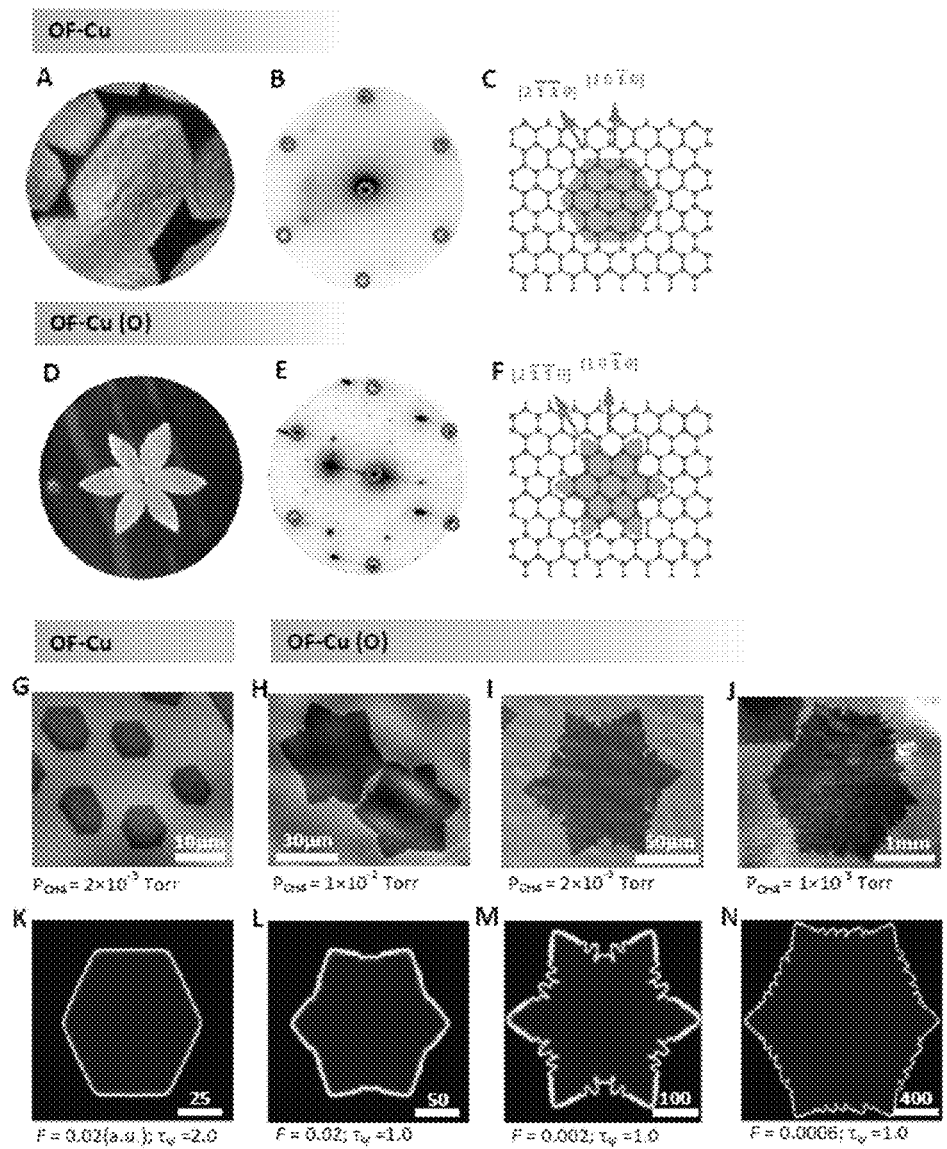
FIG. 10 shows the effect of oxygen on graphene domain shapes on Cu. (A, B, D, and E) LEEM images and corresponding LEED patterns (open circles) of graphene domains on OF-Cu and OF-Cu (O), respectively. The extra diffraction spots in LEED patterns are due to Cu faceting effects. The viewing fields in A and D are 20 and 60 μm, respectively. C and F are schematics of growth directions of the two types of graphene domains. G-J are SEM images of graphene domains grown on OF-Cu and OF-Cu (O), respectively, as a function of $P_{CH4}$. K-N are phase field simulation results as a function of characteristic attachment time and carbon flux. The scale bars in K-N refer to simulation units, corresponding to the domain sizes. Note that in K the domain shape is always hexagonal when F changes from 0.02 to 0.001.
Figure 11:
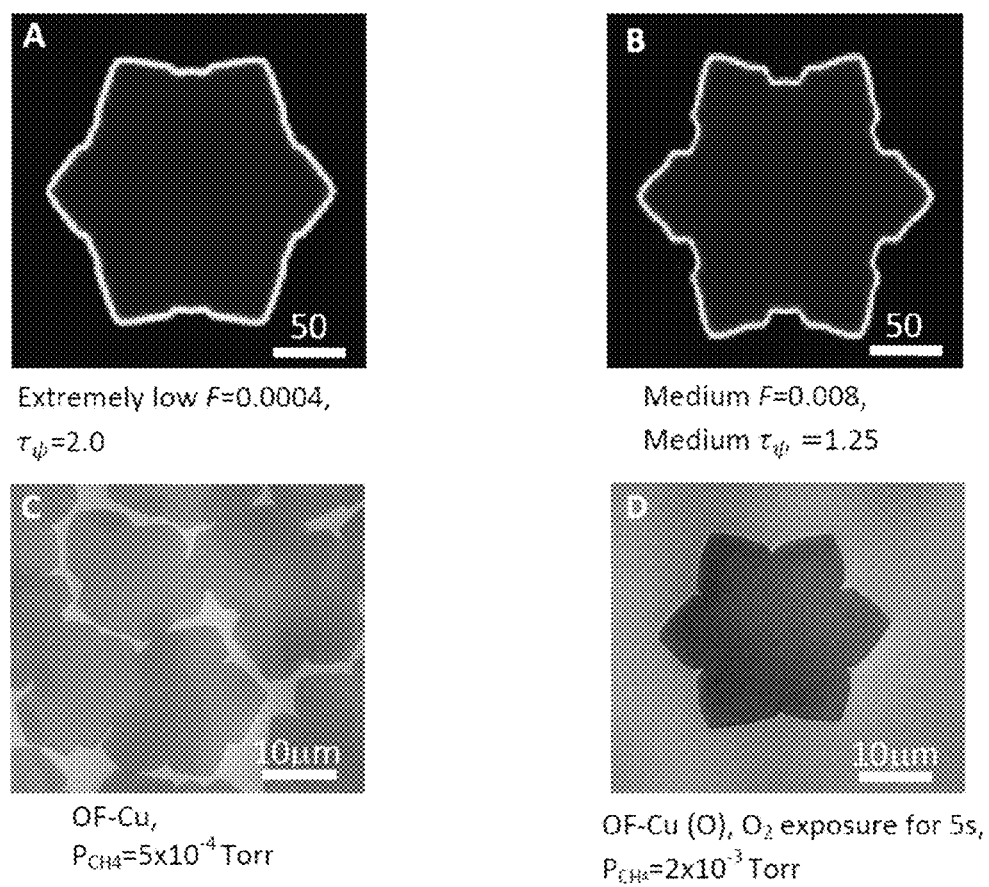
FIG. 11 shows the transitions of domain shapes between edge attachment limited growth and diffusion limited growth. Both show the less compact (or transitional) domain morphology.

It should be noted that when an extremely low F is applied, the simulated domain shape can approach multi-branched (FIG. 11A) with a long $\tau_\psi$ (high edge attachment barrier). On the other hand, when $\tau_\psi$ is increased from 1.0 to 1.25, the domain shape changes from a dendritic shape (FIG. 10M) to compact (FIG. 11B). Indeed, it is possible to achieve such transitional domain shapes between edge-attachment limited and diffusion limited regimes experimentally, when either very low $P_{CH4}$ on pristine OF-Cu or shorter $O_2$ exposure (5-10 seconds) is applied, as shown in FIG. 11C-D. The experimental results and simulated patterns agree well with each other. It should be noted that the diversity of graphene domain shapes are the results of the interaction of various parameters, such as $P_{H2}$, surface O species concentration, and carbon flux (or $P_{CH4}$).

Density Functional Theory Calculations

Figure 12:
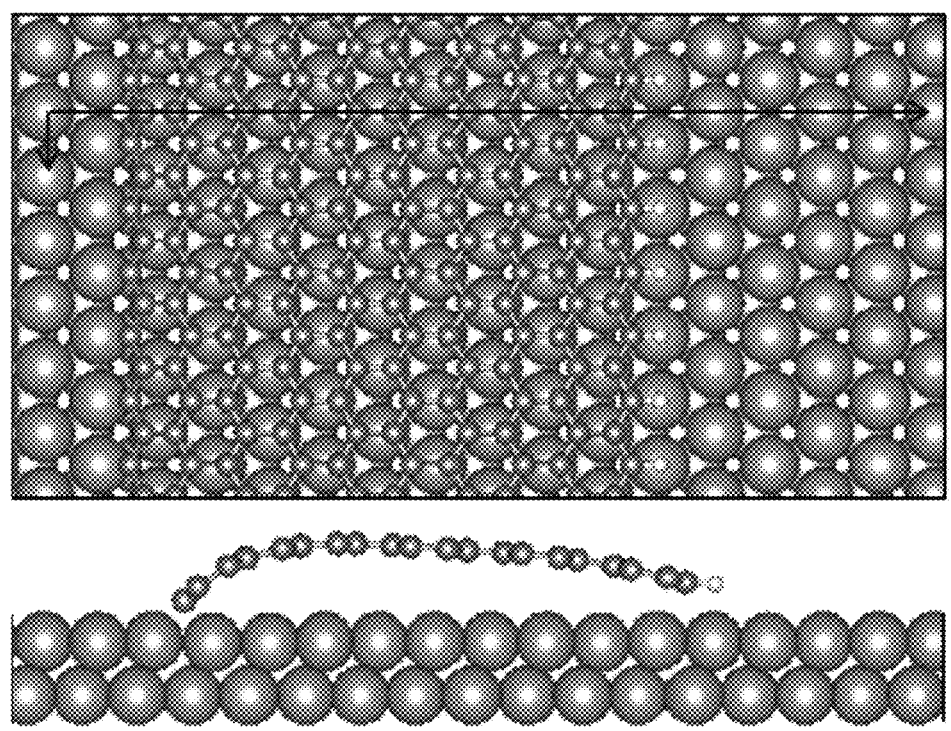
FIG. 12 shows the structure for modeling graphene edge on Cu(111). The Cu atoms are shown as large spheres, C in smaller gray spheres, and H in small white spheres. The top panel is the top view, and the bottom panel is the side view. The arrows denote the supercell vectors.

Density functional theory (DFT) calculations were performed with the Vienna ab initio Simulation Package (VASP) using ultrasoft pseudopotentials for electron-ion interactions and the Ceperley-Alder local density approximation (LDA) for the exchange correlation functional. Herein, LDA was used in order to describe the weak binding between the graphene basal planes and Cu. The supercell for modeling the graphene edge is shown in FIG. 12. A graphene ribbon is put onto a double layer Cu(111) slab, with the bottom layer fixed in the surface normal direction. One side of the graphene edge is docked onto the metal and the other side is used to model the growth front (domain edge). Vacuum spacing is kept larger than 15 Å in the direction perpendicular to the metal surface. All structures are fully relaxed until the force on each atom is less than 0.01 eV/Å. A 1×11×1 Monkhorst-Pack (MK) k-points mesh is used to sample the Brillouin zone.

Since graphene and Cu(111) have a lattice mismatch of ~4%, two sets of supercell size were used: one is based on the lattice parameter of graphene, and the other is based on that of Cu(111). The corresponding energies are shown in FIG. 8I as the upper and lower limits of the bar.

To model H and OH species on Cu(111), a 6×6 metal slab with 5 layers was used. The bottom layer was fixed in the surface normal direction. 5×5×1 MP k-points are used. Both H and OH favor the hollow site of the surface.

Figure 8:
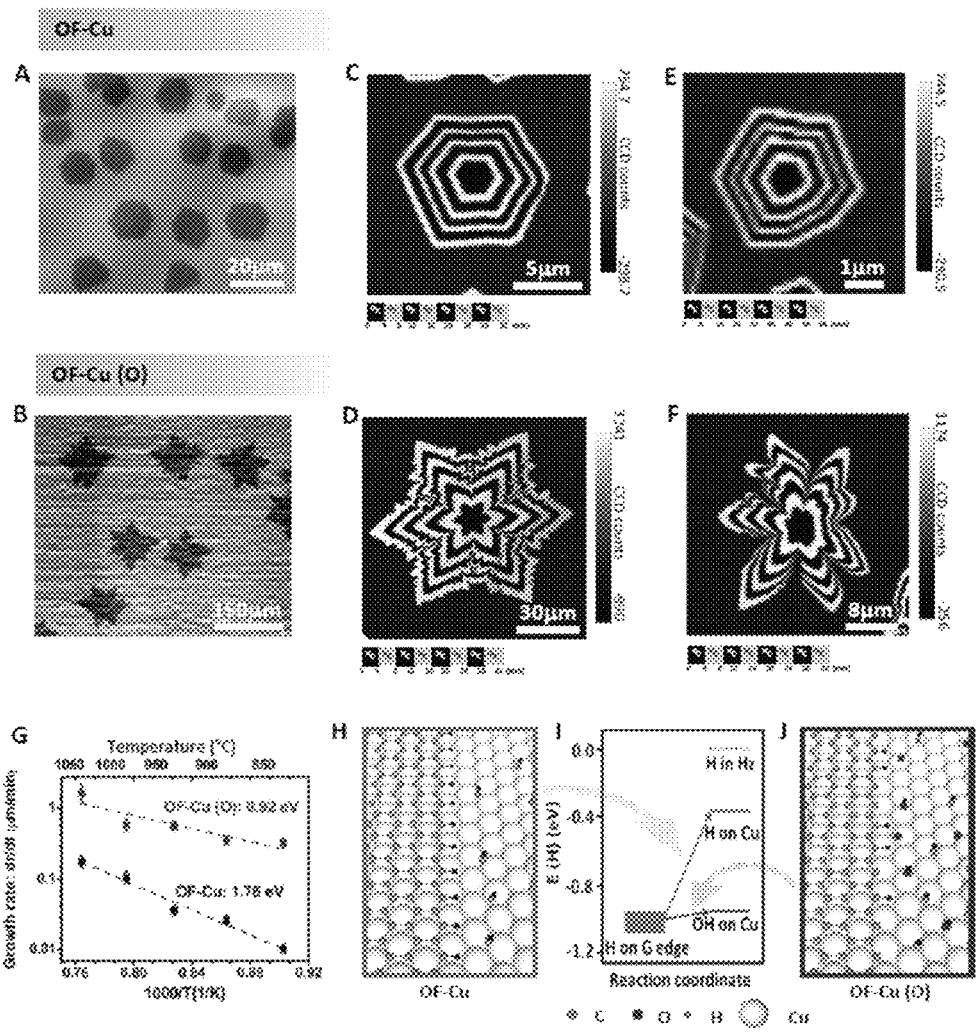
FIG. 8 shows the effect of oxygen on graphene growth kinetics. SEM images of graphene domains grown on (A) OF-Cu, and (B) OF-Cu (O). Isotope-labeled Raman maps of the 2D (G') band intensities on Si substrates for growth at (C and D) 1035° C. and (E and F) 885° C. The isotope switching intervals are indicated below each image. G are logarithmic plots of graphene domain growth rate $d\bar{r}/dt$ vs. $1/T$. The error bars are from calculations of different domains for each case, and the activation energy $E_a$ is extracted from the slope of the linear fit. J and H are atomic-scale schematics of graphene edge growth on Cu with and without the assistance of oxygen, respectively. I shows DFT calculated energies of different configurations of H attachment, in reference to H in $H_2$. The energy spread of H at the graphene edge is due to the computational uncertainty resulting from the lattice mismatch between graphene and Cu.

The energy of Hydrogen shown in FIG. 8 is defined as: E(H@X)=E(H+X)−E(X)−E($H_2$)/2, where X can be $H_2$, the Cu(111) surface, the graphene edge (G edge), etc. E(H+X) is the total energy of the system which contains both H and X, E(X) is the energy of X without H, and E($H_2$) is the energy of $H_2$ molecule.

Electrical Transport Measurements

The graphene domains/films are transferred onto $SiO_2$/Si or h-BN substrates for electron transport measurements by using the same transfer method as used for Raman characterization. For the electrically characterized samples, standard electron-beam lithography, reactive ion etching, and physical vapor deposition processes were used to pattern the graphene samples into the Hall bar geometry with Cr/Pd/Au electrodes. After device fabrication, the graphene/h-BN samples were annealed in a tube furnace under a forming gas atmosphere for 6.5 hours at 340° C. The completed Hall bar devices were imaged with atomic force microscopy (AFM) using silicon cantilevers operating in non-contact mode (upper left inset of FIG. 13F). Transport measurements were acquired in a four-terminal geometry using a standard lock-in technique at 17 Hz. Samples were cooled in a variable temperature (1.7K-300 K) liquid $^4$He flow cryostat with samples in He vapor.

Results and Discussion

Figure 7:
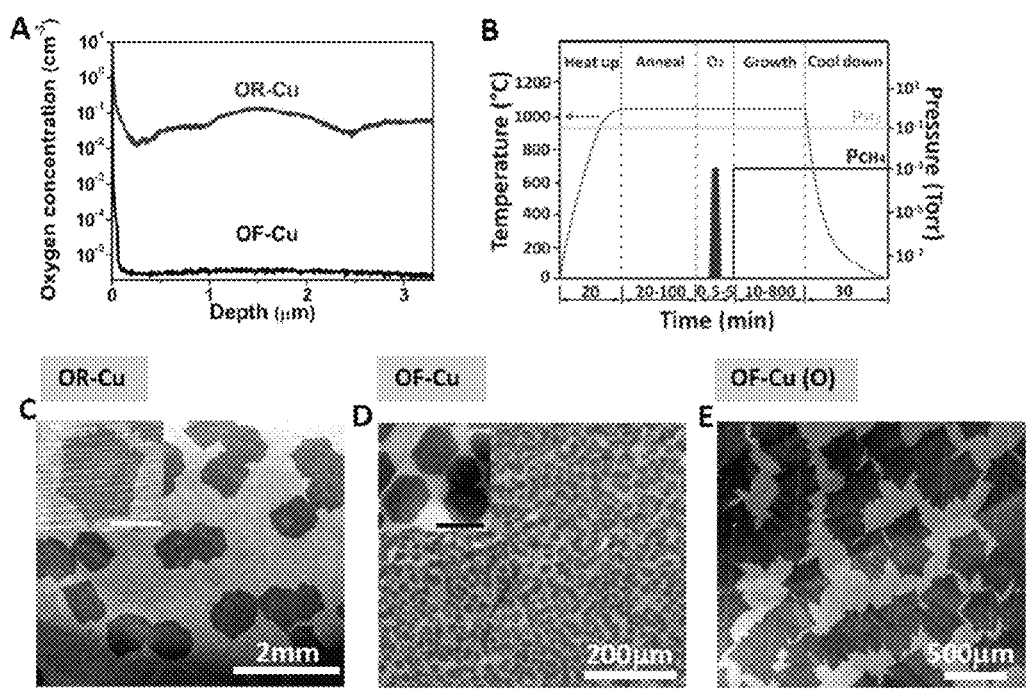
FIG. 7 shows the effect of oxygen on graphene nucleation density and domain shapes on Cu substrates. A shows TOF-SIMS depth profiles of oxygen concentration in OR-Cu and OF-Cu. B is a schematic of a typical CVD graphene growth process that includes $O_2$ exposure. Scanning Electron Microscopy (SEM) images of graphene domains grown on (C) OR-Cu, (D) OF-Cu, and (E) OF-Cu (O) respectively. In all cases, the $P_{CH4}=1\times10^{-3}$ Torr, and $P_{H2}=0.1$ Torr, while growth time was 120 min for C and E and 30 min in D. The insets in C and D are the high magnification SEM images in each case. The scale bar is 500 μm in the inset of C, and 20 μm in the inset of D.

Oxygen impurities were found to exist at different concentrations across commercially available Cu foils. Time-of-flight secondary ion mass spectrometry (TOF-SIMS) depth profile results (FIG. 7A) show that for two different types of Cu foils the oxygen concentrations are ~$10^{-2}$ and ~$10^{-6}$ at. % (the latter approaching the detection limit), hereafter referred to as 'oxygen-rich Cu' (OR-Cu) and 'oxygen-free Cu' (OF-Cu), respectively. When the two types of Cu were used to grow graphene under the same conditions in low pressure CVD, the domain density for OR-Cu is about 0.9 mm$^{-2}$, more than three orders of magnitude lower than for OF-Cu, which is about $10^3$ mm$^{-2}$ (FIGS. 7C and D). It was also observed that graphene domains on OR-Cu exhibit dendritic growth fronts, i.e., multi-branched and rough domain edges (FIG. 7C, inset), whereas graphene domains on OF-Cu are compact with sharp edges (FIG. 7D, inset). When OF-Cu was exposed to $O_2$ ($P_{O2}$=1×10$^{-3}$ Torr) for 1 min before introducing methane (CH$_4$, $P_{CH4}$=1×10$^{-3}$ Torr), as described in FIG. 7B, the resulting graphene growth on the OF-Cu exposed to $O_2$ (defined as 'OF-Cu(O)' hereafter) yields a low density of nuclei, about 3 mm$^{-2}$, and dendritic growth fronts (FIG. 7E), similar to that on OR-Cu. It can therefore be deduced that the presence of oxygen, regardless of its source, leads to the observed difference in domain density and shape. In addition, TOF-SIMS results (FIG. 1) show the presence of oxygen on Cu surface after low $H_2$ pressure ($P_{H2}$=0.1 Torr) annealing. Since graphene is grown on Cu through a surface mediated process (Li, X; Cai, L; Colombo, L; Ruoff, R S. *Nano Lett.*, 2009, 9, 4268), surface oxygen species are considered to participate in surface reactions and thus responsible for the domain growth characteristics. Both experimental and theoretical studies have established that metal surface imperfections, e.g., step edges, defects, impurities, etc., can be active sites for graphene nucleation because of higher d-band centers at these lower-coordination sites, which lead to strong binding to adsorbates. For the same reasons, these active sites are also sinks for oxygen. Thus, oxygen on Cu surfaces, either pre-existing or from $O_2$ exposure, effectively passivates the surface active sites where hydrocarbon accumulation would otherwise have taken place.

Figure 13:
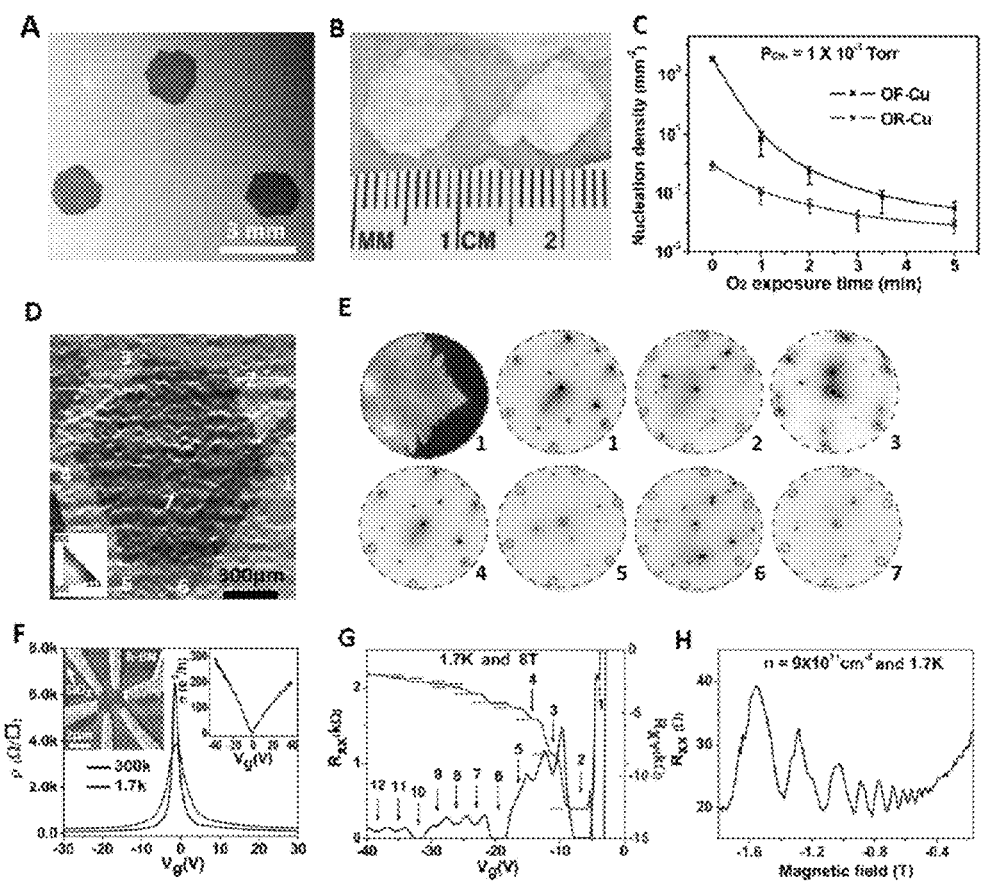
FIG. 13 displays the size, structure, and electrical transport properties of large graphene domains grown on Cu exposed to $O_2$. A is an SEM image of low density graphene domains on OR-Cu exposed to $O_2$. B is an optical image of centimeter-scale graphene domains on OR-Cu exposed to $O_2$. The sample, after graphene growth, was prepared by heating in air at 180° C. for 30 min to oxidize bare Cu and visualize graphene domains (lighter areas). C shows the graphene nucleation density as a function of $O_2$ exposure time on both OR-Cu and OF-Cu. D shows superimposed SEM and EBSD images of a graphene domain grown across Cu multi-grains. E shows one LEEM image and seven LEED patterns taken from the regions in D as marked with dashed-line circles and numbers 1-7. The extra diffraction spots in LEED patterns are due to Cu faceting effects. F is a plot of resistivity as a function of gate voltage at 1.7 K and room temperature, respectively. Upper left inset is a false-colored AFM image of the measured device on an h-BN substrate. Electrical conductivity is in the right inset of F. G shows longitudinal resistivity, $R_{xy}$, measured on right axis as a function of $V_g$. H shows $R_{xx}$ as a function of magnetic field at a fixed carrier density.

In order to further suppress graphene nucleation on Cu, the Cu substrates were exposed to varying amounts of $O_2$ ($P_{O2}$=1×10$^{-3}$ Torr, as per FIG. 7B) by simply changing the exposure time from 30 seconds to 5 minutes just before the introduction of CH$_4$. Typically, 2 min of $O_2$ exposure on OR-Cu can decrease the nucleation density to about 0.03 mm$^{-2}$ (FIG. 13A). With a longer $O_2$ exposure (5 minutes), the graphene nucleation density can decrease to a value as low as ~0.01 mm$^{-2}$, and individual domains can thus grow to a diameter larger than 1 cm after a 12 hour growth period at $P_{CH4}$=1×10$^{-3}$ Torr (FIG. 13B). The same experiments using OF-Cu give rise to similar domain growth results, i.e., the nucleation density decreases with increasing $O_2$ treatment time, as summarized in FIG. 13C. There have been various proposed strategies towards nucleation suppression; however, multiple experimental comparisons show that oxygen is the primary variable that controls the nucleation density. Oxygen therefore provides a convenient new tuning parameter for suppressing graphene nucleation and enabling growth of large domains.

Electron backscatter diffraction (EBSD) was used to map the crystal orientation of the Cu grains under a graphene domain; it shows that large graphene domains normally grow across several Cu grains, which usually have grain sizes smaller than a few millimeters even after thermal treatment (FIG. 13D). Further, low energy electron diffraction (LEED) patterns (FIG. 13E) taken at different positions on the same domain clearly show that, even though the underlying Cu is multi-grain, all of the diffraction patterns are aligned with each other, indicating that the graphene domain is a single crystal. LEED measurements were performed on randomly selected large graphene domains with varying shapes (such as in FIG. 13B) on multi-grain Cu, and confirmed that the domains are single crystals. It was found that high growth temperatures and low hydrocarbon pressures significantly facilitate single crystal graphene growth. The growth of large single crystal graphene across Cu multi-grains suggests that single-crystal Cu substrates are unnecessary to grow large single-crystal graphene films. Raman spectra of the domains transferred onto Si substrates also confirm that they are single-layer with no detectable defect related D band (FIG. 3).

Figure 14:
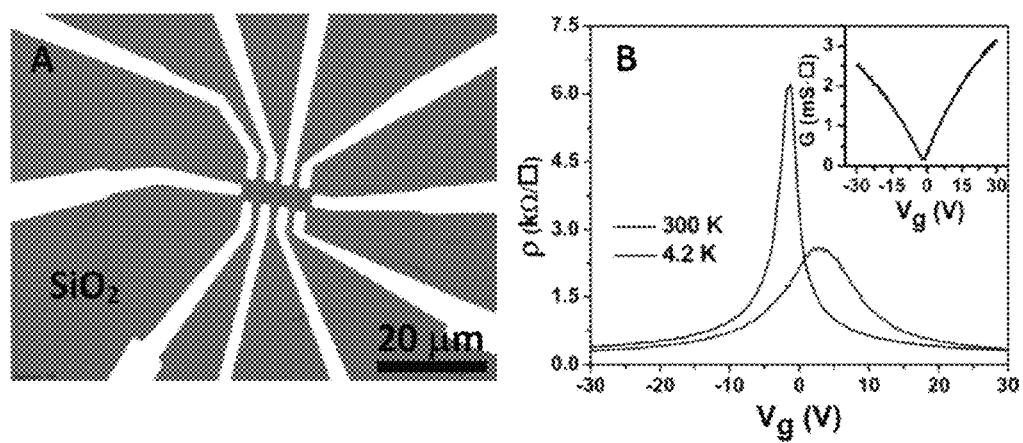
FIG. 14 shows the electrical transport probed in graphene devices realized using large graphene domains on $SiO_2$/Si substrates. A is an optical microscopy image of a device on $SiO_2$/Si substrate. B shows transfer characteristics of the device at 4.2 K and room temperature, respectively. Inset: conductivity as a function of back gate voltage at 4.2 K. The electrical transport properties of graphene devices on $SiO_2$/Si substrates demonstrate quality comparable to those of exfoliated graphene. The extracted carrier mobility is 10,800 $cm^2V^{-1}s^{-1}$ and 8,400 $cm^2V^{-1}s^{-1}$ at 4.2 K and room temperature, respectively.
Figure 15:
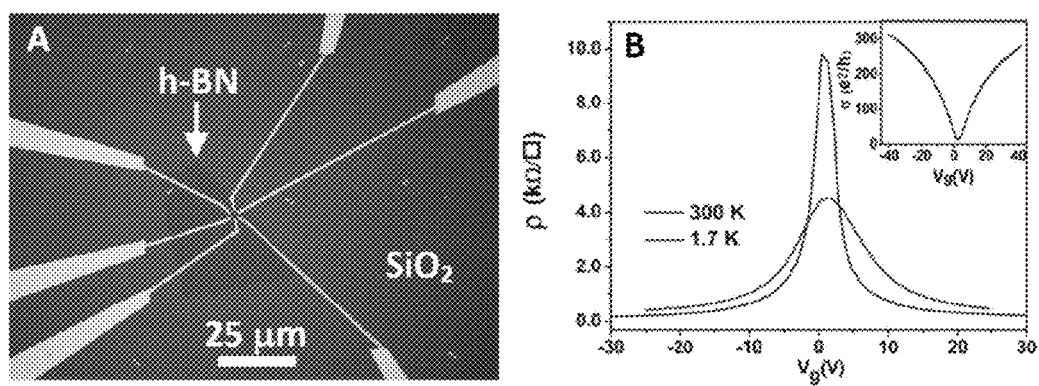
FIG. 15 displays the electrical transport of graphene devices from small compact graphene domains on h-BN/$SiO_2$/Si substrates. (A) An optical microscopy image of the device. (B) Transfer characteristics of the device at 1.7 K and room temperature, respectively. Inset is the corresponding conductivity as a function of back gate voltage. The extracted carrier mobility is 50,000 $cm^2V^{-1}s^{-1}$ and 15,000 $cm^2V^{-1}s^{-1}$ at 1.7 K and room temperature, respectively, indicating that the electrical quality of small compact graphene domains is similar to that of large dendritic domains.

Electrical and magneto-transport measurements were then performed on silicon dioxide (FIG. 14) and on hexagonal boron nitride (h-BN) substrates (FIG. 15). Resistivity as a function of back gate voltage of graphene films on h-BN, in FIG. 13F, shows narrow and symmetric Dirac peaks with the charge neutrality point Vg=−1.0V. The carrier mobility measured for three different samples ranges from 40,000 to 65,000 cm$^2$V$^{-1}$s$^{-1}$ at 1.7 K and from 15,000 to 30,000 cm$^2$V$^{-1}$s$^{-1}$ at room temperature using a carrier density independent fitting method. Magneto-transport measurements show that broken symmetry of the four-fold Landau level degeneracy and filling factors of 1-12 were observed under a magnetic field of 8 Tesla (T) (FIG. 13G). The onset of Shubnikov-de Haas oscillations was also observed at fields below 500 mT, as shown in FIG. 13H. These features suggest that the electrical quality of large graphene domains, despite having been grown with oxygen on the Cu, is among the best reported for CVD graphene and comparable to that of micromechanically exfoliated graphene.

In addition to decreasing graphene nucleation density, oxygen was found to affect graphene growth kinetics. FIG. 8A shows that graphene domains on OF-Cu are compact with a domain size ~15 μm after a 32 min growth at 1035° C. and $P_{CH4}$=2×10$^{-3}$ Torr. However, when graphene is grown on OF-Cu (O) ($O_{O2}$=1×10$^{-3}$ Torr, 30 s exposure) under the same conditions and for the same growth time, the domain size increases to ~150 μm (FIG. 8B). Clearly oxygen on the Cu surface accelerates the graphene domain growth. These results seem counterintuitive as oxygen has been associated in the past with carbon species oxidation and graphene etching. Oxygen decreases the graphene film coverage on Cu substrates by 10 times for the 32 min growth (FIG. 6). This occurs because the nucleation density on OF-Cu (O) is about 100 times lower even though the individual domain growth rate is higher.

Figure 9:
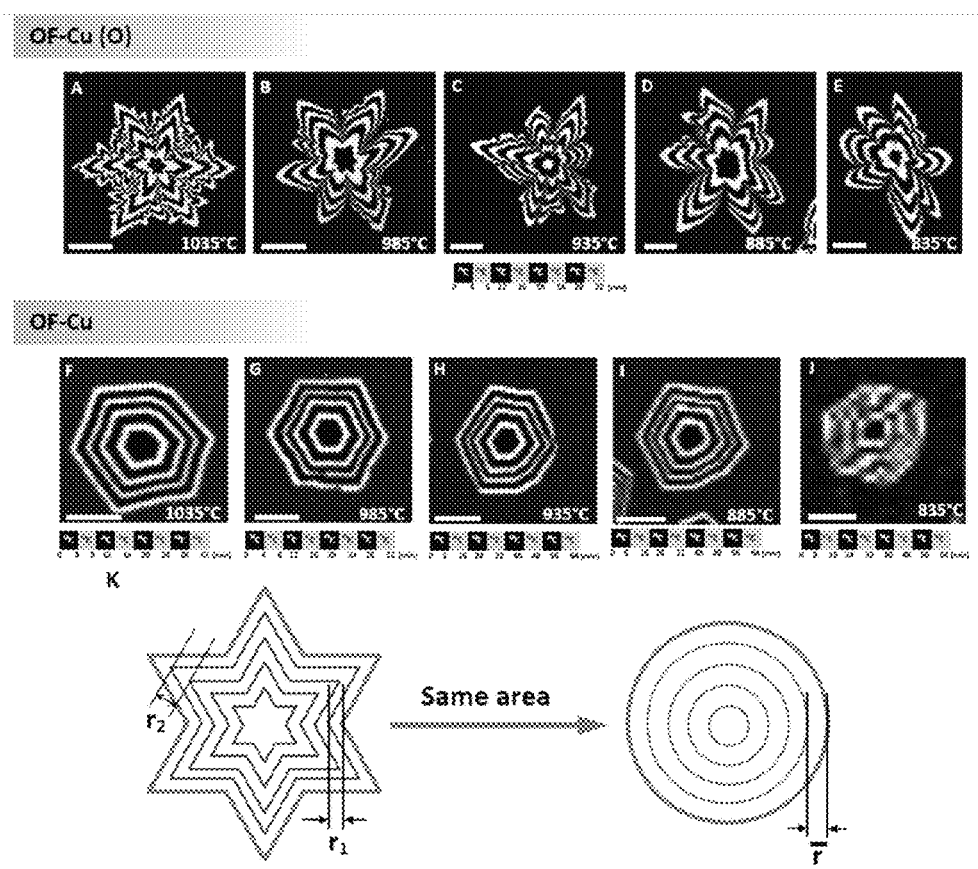
FIG. 9 A-E shows the Raman 2D band intensity maps of graphene domains grown on OF-Cu (O) under the same conditions. F-J shows Raman 2D band intensity maps of graphene domains grown on the OF-Cu surface. The carbon isotope intervals are indicated under each image. K is an illustration of a calculation method to achieve average radial growth rate of graphene domains with different shapes. The growth parameters: $P_{CH4}=2\times10^{-3}$ Torr, $P_{H2}=0.1$ Torr, $O_2$ exposure at $1\times10^{-3}$ Torr for 30 s in (A-E). Scale bars are: (A) 30 μm, (B) 15 μm, (C) 10 μm, (D) 8 μm, (E) 6 μm, (F) 5 μm, (G) 3 μm, (H) 2 μm, (I) 1.5 μm, and (J) 0.5 μm

Carbon isotope labeling and Raman mapping were used to visualize the time-evolution of domain growth at different growth temperatures, as shown in FIG. 8C-F (also in FIG. 9). Over a wide temperature range, the domains on OF-Cu remain compact hexagons as they grow; while on OF-Cu (O) the domains are always multi-branched/dendritic. The consistent domain shapes suggest that the kinetics do not change throughout the growth. Also, the radial growth rates of individual domains are nearly constant along a given orientation, as measured by the widths of the isotopically labeled bands. The growth rate can therefore be plotted as a function of temperature (FIG. 8G). According to the Arrhenius equation: $d\bar{r}/dt \sim \exp(E_a/k_B T)$, where $\bar{r}$ is the average radius (details about the calculation of $\bar{r}$ can be found in the Materials and Methods section), $E_a$ is the growth activation energy, $k_B$ is the Boltzmann constant, and T is temperature, the $E_a$ is found to be 1.76 eV for graphene on OF-Cu and 0.92 eV on OF-Cu (O), indicating that in the dynamic growth process the barrier of the rate-limiting step is reduced.

For hydrocarbons (e.g., $CH_4$) to be converted to graphene on Cu during CVD growth, the following elementary steps are expected: (1) $CH_4$ adsorption on Cu surfaces, (2) $CH_4$ (partial-) dehydrogenation, resulting in carbon species such as $CH_x$ (x=0-3), (3) surface diffusion of carbon species, and (4) carbon species attachment to graphene domain edges and incorporation into graphene lattice. Each step has associated characteristic energies and kinetics, and can be rate-limiting depending on growth conditions. Unlike on Ru and Ir, the dehydrogenation of $CH_4$ on Cu is endothermic (energetically unfavorable), and therefore the diffusing carbon species on Cu are mainly $CH_x$ (0<x<4), rather than atomic C. Based on Density Functional Theory (DFT) calculations, it was found that the hydrogen-terminated graphene edge on Cu is more energetically favorable than bare graphene edges on Cu (FIG. 8I). Therefore, C species edge attachment and lattice incorporation requires dehydrogenation, e.g., $CH_x \rightleftharpoons CH_{x-1}+H$ (x=4, 3, 2, 1), which is considered rate-limiting. In contrast, pre-adsorbed oxygen on the Cu surface can enhance the catalytic dissociation of hydrocarbons through the reaction: $CH_x+O \rightleftharpoons CH_{x-1}+OH$ (x=4, 3, 2, 1). DFT calculations have shown that the energy of H in the form of an OH group on Cu is lower than H on Cu by 0.6 eV/H (FIG. 8I), pointing to a lower activation energy of edge dehydrogenation according to the Bell-Evans-Polanyi principle. Therefore, both experimental data from the isotope labeled growth and the atomic scale calculations reveal that oxygen helps reduce the edge attachment barrier, facilitate C incorporation, and accelerate graphene growth. This scenario does not necessarily conflict with the passivation effect of oxygen on graphene nucleation. The latter is governed by different kinetic processes that typically require a much higher supersaturation density of carbon species than that during growth, in which dehydrogenation may not be the critical step.

The above picture is supported by the change of graphene domain morphology with $O_2$ treatment. Here, the graphene domains on Cu(111) are the focus. FIG. 10A shows the typical shape of graphene domains formed on OF-Cu: compact hexagons with sharp edges, as obtained from the classic Wulff construction, which is expected as a result of edge attachment-limited growth. In contrast, graphene domains grown on OF-Cu (O) become multi-branched or dendritic (FIG. 10D), typical of diffusion (mass transport) limited growth. The morphology change indicates that, with the introduction of oxygen, carbon attachment at domain edges is no longer rate-limiting, and domain growth is instead governed by carbon diffusion or equivalently carbon flux, in agreement with the observations and analysis herein. The corresponding LEED patterns (FIGS. 10B and E) show only one set of hexagonal diffraction patterns, indicating that both domains are single crystals. From this, the two domains were reconstructed on the graphene lattice (FIGS. 10C and F, respectively), both of which exhibit fast growth in the [2 $\bar{1}$ $\bar{1}$ 0] direction and slow growth in the [1 0 $\bar{1}$ 0] direction, consistent with previous reports, where hexagonal domains have been reported to have zigzag terminated edges. In other words, oxygen affects the domain shapes by modifying the growth kinetics, while preserving the six-fold crystallographic symmetry. Further, it was found that graphene domains on OF-Cu maintain a hexagonal shape when $P_{CH4}$ ranges from $1\times10^{-3}$ to $5\times10^{-2}$ Torr; whereas, on OF-Cu (O), different domain shapes appear as a function of $P_{CH4}$ (FIGS. 10H and I). The sensitive dependence of domain morphology on carbon species concentration again suggests that the growth kinetics has been brought into the diffusion limited regime by oxygen.

To test the proposed growth mechanisms, a phase field model was developed to examine the domain shape evolution. Two key parameters, namely the characteristic attachment time of carbon species ($\tau_\psi$) and carbon flux (F, reflecting the $P_{CH4}$) are varied to simulate the experimental conditions. The attachment time is closely related to the edge attachment barrier: the higher the energy barrier, the longer the characteristic attachment time. The symmetry of the graphene domains is dictated by the six-fold graphene edge energy, in agreement with experimental observations. The simulated domain shapes are shown in FIG. 10K-N. Consistent with experimental results in FIG. 10G-J, it was found that, when $\tau_\psi$ is long, the domain shape is hexagonal even if F is changed within a large range; whereas when $\tau_\psi$ decreases, the domain turns into six-branched at the same F (FIGS. 10K and L). Furthermore, at the low $\tau_\psi$ value, F becomes the dominant parameter and can tune the domain shapes from six-branched to dendritic. Thus, lowering the attachment barrier changes the domain shape in the same manner as oxygen exposure in experiment. Therefore, it is shown that a rich variety of graphene domain morphologies can be explained and reproduced when the oxygen effect is considered in the growth kinetics.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

What is claimed is:

1. A method of forming a graphene single crystal domain on a substrate comprising a metal, comprising:
    a) contacting the substrate with a passivating gas to thereby decrease the number of nucleating sites on the substrate by at least 50% to thereby create a low nucleation site density substrate, wherein the passivating gas comprises $O_2$, sulfur, selenium, or a combination thereof, and wherein the passivating gas is provided at a pressure of from $1\times10^{-3}$ to 760 Torr; and
    b) contacting the low nucleation site density substrate with a working gas at a first elevated temperature, wherein the working gas is provided at a pressure of from $1\times10^{-6}$ Torr to 0.1 Torr, and wherein the working gas comprises a hydrocarbon gas;
    thereby forming a graphene single crystal domain on the low nucleation site density substrate.

2. The method of claim 1, wherein the substrate comprises a metal foil.

3. The method of claim 1, wherein the substrate comprises a dielectric substance coated with a metal.

4. The method of claim 1, wherein the substrate comprises a wafer coated with a metal.

5. The method of claim 1, wherein the method further comprises an annealing step before said contacting steps.

6. The method of claim 5, wherein the annealing step comprises contacting the substrate with an annealing gas at a second elevated temperature.

7. The method of claim 6, wherein annealing gas comprises hydrogen.

8. The method of claim 6, wherein the substrate is contacted with the annealing gas for from 1 second to 100 minutes.

9. The method of claim 6, wherein the annealing gas is provided at a pressure of from $1\times10^{-6}$ to 760 Torr.

10. The method of claim 6, wherein the second elevated temperature is at least 1000° C.

11. The method of claim 1, wherein the substrate is contacted with the passivating gas for from 1 second to 20 minutes.

12. The method of claim 1, wherein the passivating gas is flowed at a rate of from 1 to 10,000 sccm.

13. The method of claim 1, wherein the substrate is contacted with the passivating gas at a temperature of at least 20° C.

14. The method of claim 1, wherein the passivating gas comprises $O_2$.

15. The method of any claim 1, wherein the substrate is contacted with the working gas for from 1 to 800 minutes.

16. The method of claim 1, wherein the working gas is flowed at a rate of from 1 to 10,000 sccm.

17. The method of claim 1, wherein the first elevated temperature is from 300° C. to 1080° C.

18. The method of claim 1, wherein the working gas comprises one or more of the following: ethylene, acetylene, methane, benzene, toluene, ethane, hexane, heptanes, and octane.

19. The method of claim 1, wherein the working gas comprises methane.

20. The method of claim 1, wherein the number of nucleation sites is decreased by at least 75%.

21. The method of claim 1, wherein the density of nucleation sites on the low nucleation density substrate is less than 1000 $mm^2$.

22. The method of claim 1, wherein the density of nucleation sites on the low nucleation density substrate is less than 100 $mm^2$.

23. The method of claim 1, wherein the substrate comprises copper.

24. The method of claim 23, wherein the copper is oxygen rich.

25. The method of claim 23, wherein the copper is substantially oxygen free.

26. The method of claim 1, wherein the graphene single crystal domain is at least 100 micrometers in size.

27. The method of claim 1, wherein the graphene single crystal domain is at least 1 centimeter in size.

28. The method of claim 1, wherein the graphene single crystal domain density on the substrate is 100 $mm^{-2}$ or less.

29. The method of claim 1, wherein the graphene single crystal domain is dendritic in shape.

30. A method of forming a graphene single crystal domain, comprising:
   contacting a surface of an oxygen rich substrate having nucleation sites with a working gas at an elevated temperature, wherein the surface of the oxygen rich substrate comprises $10^{-2}$ atomic % oxygen or more;
   wherein the oxygen rich substrate comprises a metal;
   wherein the working gas comprises a hydrocarbon gas;
   wherein the density of nucleation sites on the surface of the oxygen rich substrate is less than 100 $mm^{-2}$;
   thereby forming a graphene single crystal domain on the surface of the oxygen rich substrate.

* * * * *

UNITED STATES PATENT AND TRADEMARK OFFICE
CERTIFICATE OF CORRECTION

PATENT NO. : 10,072,355 B2
APPLICATION NO. : 14/252953
DATED : September 11, 2018
INVENTOR(S) : Luigi Colombo et al.

Page 1 of 1

It is certified that error appears in the above-identified patent and that said Letters Patent is hereby corrected as shown below:

In the Claims

In Claim 15, the preamble of the claim which reads "The method of any claim 1..." should read "The method of claim 1..."

In Claim 21, the portion of the claim which reads "...less than 1000 mm$^2$" should read "...less than 1000 mm$^{-2}$."

In Claim 22, the portion of the claim which reads "...less than 100 mm$^2$" should read "...less than 100 mm$^{-2}$."

Signed and Sealed this
First Day of January, 2019

Andrei Iancu
*Director of the United States Patent and Trademark Office*